(12) United States Patent
Onicha et al.

(10) Patent No.: US 9,306,110 B2
(45) Date of Patent: Apr. 5, 2016

(54) APPARATUS AND METHODS FOR CONTINUOUS FLOW SYNTHESIS OF SEMICONDUCTOR NANOWIRES

(71) Applicant: US Nano LLC, South Bend, IN (US)

(72) Inventors: Anthony C. Onicha, Lansing, IL (US); Louise E. Sinks, South Bend, IN (US); Stefanie L. Weber, South Bend, IN (US)

(73) Assignee: US Nano LLC, Sarasota, FL (US)

( * ) Notice: Subject to any disclaimer, the term of this patent is extended or adjusted under 35 U.S.C. 154(b) by 0 days.

(21) Appl. No.: 14/446,285

(22) Filed: Jul. 29, 2014

(65) Prior Publication Data

US 2015/0037926 A1 Feb. 5, 2015

Related U.S. Application Data

(60) Provisional application No. 61/860,330, filed on Jul. 31, 2013.

(51) Int. Cl.
*H01L 29/06* (2006.01)
*H01L 31/0352* (2006.01)
*H01L 33/04* (2010.01)
*H01L 31/18* (2006.01)
*B05C 3/10* (2006.01)

(52) U.S. Cl.
CPC ............. *H01L 31/1828* (2013.01); *B05C 3/10* (2013.01); *H01L 31/035209* (2013.01); *H01L 31/18* (2013.01); *Y02P 70/521* (2015.11)

(58) Field of Classification Search
None
See application file for complete search history.

(56) References Cited

U.S. PATENT DOCUMENTS

| | | |
|---|---|---|
| 5,505,928 A | 4/1996 | Alivisatos et al. |
| 6,682,596 B2 | 1/2004 | Zehnder et al. |
| 6,788,453 B2 | 9/2004 | Banin et al. |
| 6,869,545 B2 * | 3/2005 | Peng et al. ............. 252/301.6 S |
| 7,316,967 B2 | 1/2008 | Yen et al. |
| 8,110,510 B1 | 2/2012 | Fanfair et al. |
| 8,259,772 B2 | 9/2012 | Krahne et al. |
| 8,294,267 B2 | 10/2012 | Banin et al. |
| 8,354,090 B2 | 1/2013 | Han et al. |
| 8,354,785 B2 | 1/2013 | Clough et al. |

(Continued)

FOREIGN PATENT DOCUMENTS

WO 2010040100 A2 4/2010
WO 2010051405 A1 5/2010

OTHER PUBLICATIONS

Cozzoli et al. Synthesis, Properties and Perspective of Hybrid Nanoncrystal Structures. Chemical Society Reviews, 35:1195-1208, 2006. Entire document.
Grebinkski et al. Solution-Based Straight and Branched CdSe Nanowires. Chem. Mater. 16 (25); 5260-5272, 2004. Entire document.
Lamer et al., Theory, Production and Mechanism of Formation of Monodispersed Hydrosols, Journal of The American Chemical Society, vol. 72, No. 11, Nov. 17, 1950.

(Continued)

*Primary Examiner* — Pamela E Perkins
(74) *Attorney, Agent, or Firm* — Whyte Hirschboeck Dudek S.C.

(57) ABSTRACT

Apparatuses and methods for synthesizing nanoscale materials are provided, including semiconductor nanowires. Precursor solutions include mixed reagent precursor solutions of metal and chalcogenide precursors and a catalyst, where such solutions are liquid at room temperature. The precursor solutions are mixed by dividing a solution flow into multiple paths and converging the paths to form a uniform solution. A thermally controlled reactor receives the uniform solution to form semiconductor nanowires. Various electronic, optical, and sensory devices may employ the semiconductor nanowires described herein, for example.

11 Claims, 15 Drawing Sheets

(56) References Cited

U.S. PATENT DOCUMENTS

| | | | |
|---|---|---|---|
| 2006/0087048 A1* | 4/2006 | Mello et al. | 264/11 |
| 2006/0273328 A1* | 12/2006 | Niu et al. | 257/79 |
| 2008/0128761 A1* | 6/2008 | Banin et al. | 257/288 |
| 2009/0291557 A1 | 11/2009 | McPeak et al. | |
| 2011/0253032 A1 | 10/2011 | Jeong et al. | |
| 2011/0272668 A1* | 11/2011 | Taylor et al. | 257/13 |
| 2013/0062565 A1* | 3/2013 | Schreuder et al. | 252/301.16 |

OTHER PUBLICATIONS

Wang et al. Spectroscopic Identification of Tri- n -octylphosphine Oxide (TOPO) Impurities and Elucidation of Their Roles in Cadmium Selenide Quantum-Wire Growth. J Am Chem Soc 2009;131:4983-94.

Wang et al. The trouble with TOPO; identification of adventitious impurities beneficial to the growth of cadmium selenide quantum dots, rods, and wires. Nano Lett 2008;8:3521-4.

Kuno et al. Solution-Based Straight and Branched CdTe Nanowires. Chem Mater 2006;18:5722-32.

Yu et al. Cadmium selenide quantum wires and the transition from 3D to 2D confinement. J Am Chem Soc 2003; 125:16168-9.

Zhuang et al. Composition and bandgap-graded semiconductor alloy nanowires. Adv Mater 2012;24:13-33.

Li et al. Controlled Synthesis of CdSe Nanowires by Solution-Liquid-Solid Method. Adv Funct Mater 2009;19:3650-61.

Kuno M. An overview of solution-based semiconductor nanowires: synthesis and optical studies. Phys Chem Chem Phys 2008;10:620.

Wang et al. Solution-liquid-solid growth of semiconductor nanowires. Inorg Chem 2006;45:7511-21.

Zhuang et al. Controlled synthesis of semiconductor nanostructures in the liquid phase. Chem Soc Rev 2011;40:5492.

Gómez-de et al. Microreactor with integrated temperature control for the synthesis of CdSe nanocrystals Electronic Supplementary Information ( ESI ) Table of contents Temperature characterization of the microsystem. Lab Chip 2012;12:1-4.

Chan et al. Reproducible, high-throughput synthesis of colloidal nanocrystals for optimization in multidimensional parameter space. Nano Lett 2010;10:1874-85.

Puthussery et al. Band-Filling of Solution-Synthesized CdS Nanowires. ACS Nano 2008;2:357-67.

Onicha et al. Controlled synthesis of compositionally tunable ternary PbSe(x)S(1-x) as well as binary PbSe and PbS nanowires. ACS Nano 2012;6:2833-43.

Petchsang et al. Low temperature solution-phase growth of ZnSe and ZnSe/CdSe core/shell nanowires. Nanoscale 2011;3:3145-51.

Murray et al. Synthesis and Characterization of Monodisperse Nanocrystals and Close-Packed Nanocrystal Assemblies. Annu Rev Mater Sci 2000;30:545-610.

Cho et al. Designing PbSe nanowires and nanorings through oriented attachment of nanoparticles. J Am Chem Soc 2005;127:7041-7.

Winterton et al. A novel continuous microfluidic reactor design for the controlled production of high-quality semiconductor nanocrystals. J Nanoparticle Res 2008; 10-893-905.

Yu et al. In-situ observation of nucleation and growth of PbSe magic-sized nanoclusters and regular nanocrystals. Small 2011;7:2250-62.

Yu K. CdSe Magic-Sized Nuclei, Magic-Sized Nanoclusters and Regular Nanocrystals: Monomer Effects on Nucleation and Growth. Adv Mater 2012;24:1123-32.

Jiang et al. Role of magic-sized clusters in the synthesis of CdSe nanorods. ACS Nano 2010;4:1561-72.

Cossairt et al. CdSe Clusters: At the Interface of Small Molecules and Quantum Dots. Chem Mater 2011;23:3114-9.

Murray et al. Synthesis and characterization of nearly monodisperse CdE (E= S, Se, Te) semiconductor nanocrystallites. J Am Chem Soc 1993;115:8706-15.

Wang et al. Morphology control of cadmium selenide nanocrystals: insights into the roles of di-n-octylphosphine oxide (DOPO) and ucid (DOPA). J Am Chem Soc 2012;134:5369-80.

Yen et al. A Continuous-Flow Microcapillary Reactor for the Preparation of a Size Series of CdSe Nanocrystals. Adv Mater 2003;15:1858-62.

Krishnadasan et al. Intelligent routes to the controlled synthesis of nanoparticles. Lab Chip 2007;7:1434-41.

Marre et al. Supercritical Continuous-Microflow Synthesis of Narrow Size Distribution Quantum Dots. Adv. Mater 2008;20:4830-4.

Yang et al. Synthesis of quantum dots via microreaction: structure optimization for microreactor system. J Nanoparticle Res 2011;13:3335-44.

Wu et al. A New Class of Capping Ligands for CdSe Nanocrystal Synthesis. Chem Mater 2005;17:6436-41.

Bullen et al. Nucleation and Growth Kinetics of CdSe Nanocrystals in Octadecene. Nano Lett 2004;4:2303-7.

Kopping et al. Identification of acidic phosphorus-containing ligands involved in the surface chemistry of CdSe nanoparticles prepared in tri-N-octylphosphine oxide solvents. J Am Chem Soc 2008;130:5689-98.

Li et al. Correlation of CdS nanocrystal formation with elemental sulfur activation and its implication in synthetic development. J Am Chem Soc 2011;133:17248-56.

Yang et al. High-Temperature Synthesis of CdSe Nanocrystals in a Serpentine Microchannel: Wide Size Tunability Achieved under a Short Residence Time. Cryst Growth Des 2009;9:1569-74.

Amelia et al. Structural and size effects on the spectroscopic and redox properties of CdSe nanocrystals in solution: the role of defect states. Chemphyschem 2011;12:2280-8.

Goebl et al. Solution-based II-VI core/shell nanowire heterostructures. J Am Chem Soc 2008;130:14822-33.

Evans et al. Mysteries of TOPSe revealed: insights into quantum dot nucleation. J Am Chem Soc 2010;132:10973-5.

Bullen et al. High Activity Phosphine-Free Selenium Precursor Solution for Semiconductor Nanocrystal Growth. Chem Mater 2010;22:4135-43.

Jasieniak et alP. Phosphine-free synthesis of CdSe nanocrystals. J Phys Chem B 2005;109:20665-8.

Liu et al. Shape control of CdSe nanocrystals with zinc blende structure. J Am Chem Soc 2009;131:16423-9.

Shen et al. Phosphine-free synthesis of high quality ZnSe, ZnSe/ZnS, and Cu-, Mn-doped ZnSe nanocrystals. Dalton Trans 2009:10534-40.

Jasieniak et al. From Cd-rich to Se-rich—The manipulation of CdSe nanocrystal surface stoichiometry. J Am Chem Soc 2007;129:2841-8.

Mahler et al. Ligand-controlled polytypism of thick-shell CdSe/CdS nanocrystals. J Am Chem Soc 2010;132:953-9.

Lu et al. Growth of Single Crystal Silicon Nanowires in Supercritical Solution from Tethered Gold Particles on a Silicon Substrate. Nano Lett 2003;3:93-9.

McPeak et al. ZnO Nanowires Grown by Chemical Bath Deposition in a Continuous Flow Microreactor. Cryst Growth Des 2009;9:4538-45.

Laocharoensuk et al. Flow-based solution-liquid-solid nanowire synthesis. Nat Nanotechnol 2013;8:660-6.

Puthussery et al. Facile synthesis and size control of II-VI nanowires using bismuth salts. Small 2009;5:1112-6.

Wang et al. Solution-solid-solid mechanism: Superionic conductors catalyze nanowire growth. Nano Lett 2013;13:3996-4000.

Yong al. Control of the Morphology and Size of PbS Nanowires Using Gold Nanoparticles. Chem Mater 2006; 18:5965-72.

Yu et al. Solution-Liquid-Solid Growth of Soluble GaAs Nanowires. Adv Mater 2003;15:416-9.

Liu et al. Mechanistic study of precursor evolution in colloidal group II-VI semiconductor nanocrystal synthesis. J Am Chem Soc 2007;129:305-12.

Petchsang et al. Light induced nanowire assembly: the electrostatic alignment of semiconductor nanowires into functional macroscopic yarns. Adv Mater 2013;25:601-5.

* cited by examiner

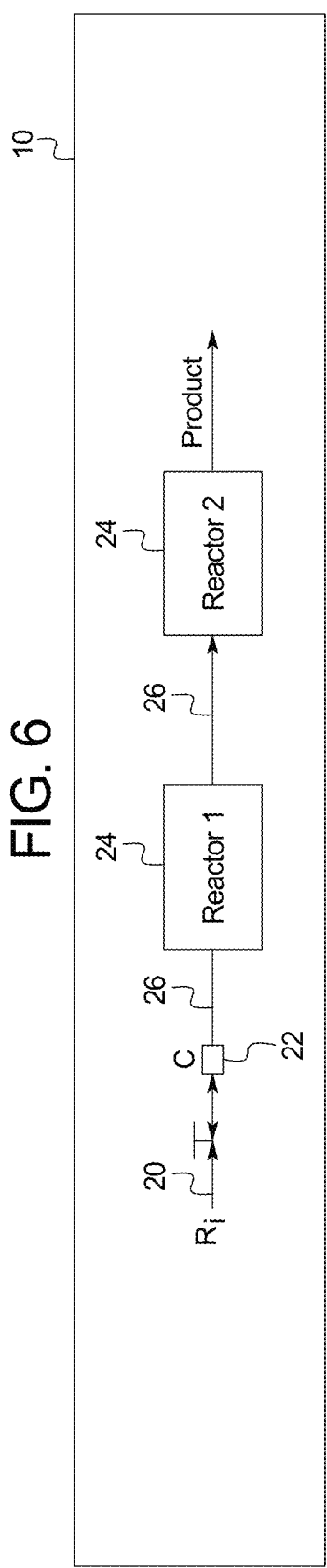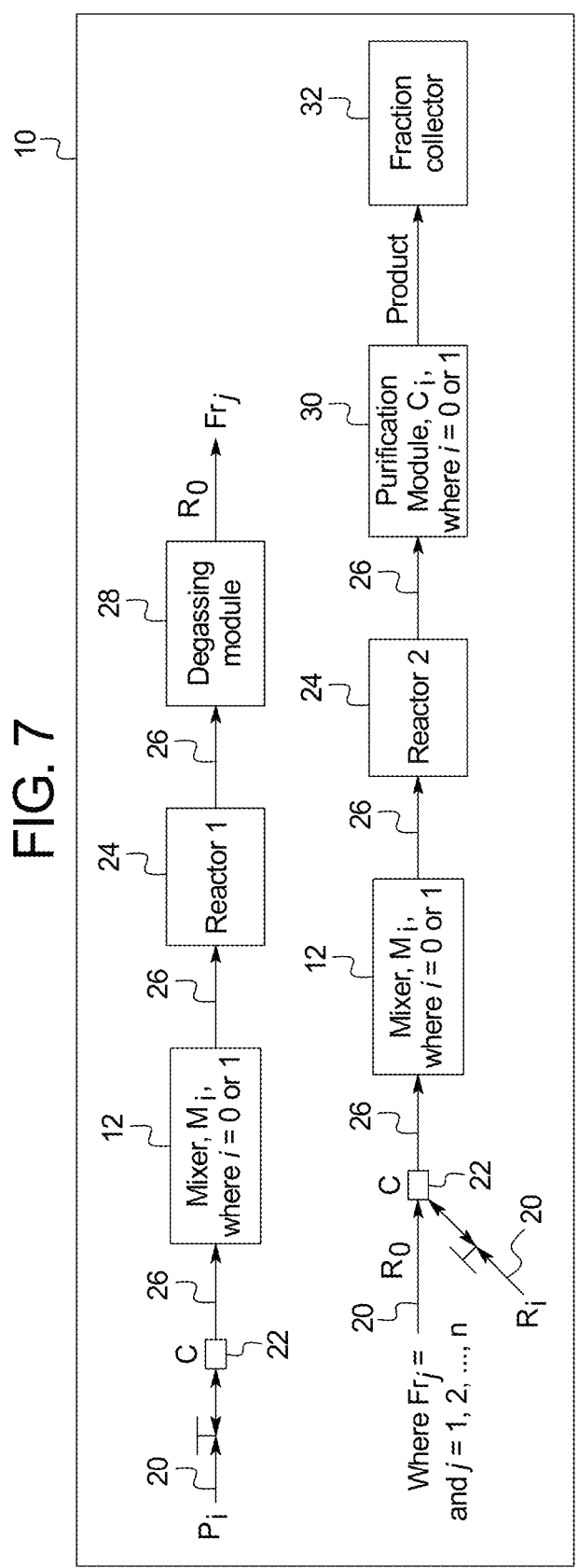

APPARATUS AND METHODS FOR CONTINUOUS FLOW SYNTHESIS OF SEMICONDUCTOR NANOWIRES

CROSS-REFERENCE TO RELATED APPLICATIONS

This application incorporates by reference and claims priority to U.S. Provisional Application 61/860,330 filed on Jul. 31, 2013.

GOVERNMENT RIGHTS

This invention was made with U.S. Government support under SBIR Phase I Grant No. IIP-1214077 awarded by the National Science Foundation. The U.S. Government has certain rights in the invention.

BACKGROUND OF THE INVENTION

The present subject matter relates generally to nanoscale materials and ways of producing such materials, including semiconductor nanowires.

Nanoscale materials, such as nanoparticles and nanowires, are the subject of considerable research in materials science. Part of the interest stems from the fact that materials formed as nanowires frequently exhibit properties that are dramatically different from the corresponding bulk materials, including unique optical, electronic, and mechanical properties.

Nanowires may be used in a wide variety of applications such as various integrated circuits, chemical and biological sensors, optoelectronic devices, and photovoltaics. For example, there is an interest in developing semiconductor nanowire-based devices for use in various electronic devices and systems to replace or supplement complementary metal-oxide-semiconductor (CMOS) technologies. As another example, nanowires have a large surface area, and thus may be advantageously applied to various sensing modalities and configured as particular sensors, e.g., for biological analytes and other analytes. Reliable large-scale production of nanowires is essential for the commercialization of products based on semiconductor nanowires.

High quality nanowires have uniform diameters along their lengths, and smooth surfaces.[1] Other reported attributes of high quality nanowires include reasonably narrow diameter distributions (standard deviations of 10-20% of the mean diameters), lengths of several micrometers, and straightness of the synthesized nanowires.[2] Nanowires are regarded as low quality if they have kinks and other surface defects, relatively shorter, and branched, especially if these qualities cannot be controlled or arise from synthetic protocols that otherwise should give high quality nanowires.[1, 2] Low synthetic yield, and poor size distributions are also associated with low quality nanowires.[3] Branching in nanowires in itself is usually not regarded as a poor quality if that is the intended morphology, and the branched nanowires can be synthesized in a controlled manner and do not exhibit any other attribute of low quality nanowires. [3, 4]

Semiconductor nanowires may be synthesized using a range of conditions, from high temperature (e.g., less than 1100° C.) gas-phase reactions,[5] to relatively low temperature (e.g., less than 250° C.) solution-phase conditions. Solution-phase routes to semiconductor nanowires are of particular interest due to the potential for size and shape control, chemical surface passivation, colloidal dispersibility, and adaptability to high throughput continuous processes. Solution methods allow greater control over structure and function than gas phase methods.[6]

Solution-phase routes to semiconductor nanowires include non-catalyzed (e.g., oriented attachment, and solvothermal/hydrothermal growth), and catalyzed (e.g., supercritical fluid-liquid-solid growth, and solution-liquid-solid growth) approaches. The most reliable and reproducible method has proved to be the catalyzed methods. In the catalyzed approach, small metal droplets (also called metal seeds, metal seed particles, or catalyst) are used to induce the asymmetric crystallization of semiconductors from precursors in solution.[7] Among the catalyzed solution-phase routes, solution-liquid-solid approach affords the use of lower temperatures (e.g., less than 250° C.) to grow semiconductor nanowires with such advantages as nanowire crystallinity, length, and diameter control.[8] The solution-liquid-solid (SLS) is so named based on a proposed mechanism wherein the nanomaterials precursors are in solution, then partition in to the liquid catalyst, and lastly the solid nanowire is grown.

Common among the solution-phase routes to many nanomaterials is a hot-injection technique in which a precursor solution at room temperature is injected into a second precursor solution held at a certain elevated temperature in order to rapidly produce a large amount of monomers to trigger a burst of nucleation and subsequent growth of nanomaterials in a controlled manner in the reaction system.[9] The solution-phase routes are typically performed as a small scale batch process to achieve the required control over thermal and mass transport properties needed to control nucleation and growth. However, even when the hot-injection reaction is done on the small scale, the control of the needed parameters is not as precise as desired.[10, 11]

Conventionally, cadmium selenide nanowires are produced in solution by the hot-injection method, where the reagent solution containing the catalyst and selenium source is injected into a hot (220° C.-300° C.) vessel containing the cadmium precursor solution. The hot injection method is also widespread in the synthesis of other semiconductor nanostructures like CdS, CdTe, PbS, PbSe, ZnSe, etc.[3, 12-15] It is widely held that the rapid temperature jump experienced by the injected reagent solution is necessary to nucleate the metal seed particles, and induce rapid growth of the nanowires from the seeds.[7, 9] Generally in the growth of semiconductor nanocrystals, the requisite supersaturation and subsequent nucleation can be triggered by rapid injection of a precursor solution into a vigorously stirred flask solution containing a hot (150-350° C.) solvent or another precursor solution.[15] The growth of nanowires typically takes 1-5 minutes, and the temperature must remain constantly high post-injection, as a drop in temperature can lead to a variety of other nanomaterial morphologies such as rings, quantum dots, and other undesired by-products.[16]

Similarly, nanowire production may suffer if all the reagents are mixed together and concurrently heated to the reaction temperature. In the batch process, where heat transfer is very slow due to the volume of reagent being heated, it is difficult to rapidly increase the precursor concentration above the nucleation threshold, which leads to the short nucleation critical to form nanoparticles.[15] In the hot injection method, this nucleation burst arises from the rapid injection of new reagents and the dramatic alteration of the temperature profile.[17] The poor production of nanowires may be due to the numerous side reactions that may occur at lower temperatures that serve to consume all the reagents. A side reaction of particular note is the formation of magic sized clusters, which can form at relatively low temperatures, including room temperature.[18-21] Magic clusters are small clusters of a few to several hundred molecules, which are unusually stable compared to other clusters of similar sizes. Not only do these clusters consume the precursors and decrease the yield of the desired product, but they may also be intermediates in the synthesis of certain morphologies of nanomaterials, and produce undesired by-products.[20] Thus, despite the difficulties of the hot injection process, it is the conventional route to the solution synthesis of nanowires. [22, 23]

A disadvantage of the hot-injection method is that it is not scalable. For example, to scale up the production of nanowires in a batch hot-injection process, large amounts of cool reagents solutions must be injected into large amounts of hot reagent solutions. Here, the temperature and the reaction profiles may be different and these parameters may affect the quality of the produced nanowires. Additionally, further scale up or continuous production may be hampered because the set-up must be constantly disassembled after each process, and the process may need to be optimized at each scale. Quantum dots were originally made by hot-injection, but the commercial process for production of quantum dots is a continuous flow method.[24] A variety of methods and apparatuses for making quantum dots via flow technology have been patented.[25-27]

While quantum dots and nanowires are both made by the hot injection method, and in some case have extremely similar reagents used, innovations made for quantum dot synthesis that enabled translation of the quantum dot synthetic process to continuous flow methods have not been successfully applied to nanowire synthesis.

For example, trioctylphosphine oxide (TOPO) is a chemical used as a solvent in the hot-injection synthesis of both CdSe nanowires [4, 6, 8] and quantum dots [15, 28]. Traditionally, in the example of CdSe nanowires, solution-based synthesis of CdSe nanowires (NWs) have been carried out using trioctylphosphine oxide (TOPO) as the solvent in a batch synthesis procedure. Even highly pure TOPO contains impurities that have a strong impact on the reliability of nanomaterials synthesis.[1, 2, 29] Despite the problems with TOPO, the recommended procedure in nanowires synthesis is to purify TOPO in-house, and dope in trace amounts of alkylphosphinic acids to produce the desired morphology.[2] These same issues impact quantum dot synthesis, however, the quantum dot synthesis has been optimized to reduce or eliminate TOPO. This not only improves the quality and reliability of quantum dot synthesis, but is an enabling factor that allows quantum dots to be produced in a flow reactor.

TOPO limits the translation of many syntheses to a flow configuration because it is solid at room temperature, and thus problematic to flow.[30] It has been shown that TOPO can be eliminated[31-37] or reduced/diluted[38, 39] in quantum dot synthesis without impacting the quality of the quantum dots. This then enables a flowable reagent mixture, which enables translation of the system to a flow reactor. Elimination or reduction/dilution of TOPO in CdSe nanowire synthesis has not been reported.

Similarly, the conventional selenium source for the synthesis of metal selenide nanowires is selenium powder dissolved in trioctylphosphine (TOP-Se).[6, 14, 16] A similar procedure is used to create other chalcogenide sources (E=S, Se, Te) such as TOP-S,[40] TOP-Te,[8] etc. However, TOP-Se is very air-sensitive and may result in reproducibility problems with the formation of the nanowires, owing to the impurities found in trioctylphosphine.[41] As a result, alternatives to TOP-E in solution phase metal-chalcogenide nanomaterials synthesis are needed. Again, the synthesis of quantum dots has been optimized to use alternate chalcogenide sources, such as elemental selenium dissolved in 1-octadecene (Se-ODE),[42-46] or S-ODE,[45, 47]. However, again, application of metal-chalcogenide semiconductor nanowire synthesis using E-ODE as the selenium precursor has not been reported.

The batch hot injection method is usually accompanied by a temperature drop when the cool reagent solution is added to a hot solution to initiate the process of nanowire formation. After the injection, the reaction temperature is maintained while the nanowires are allowed to grow for a specific amount of time, usually 1-5 min. The temperature drop, as well as the time it takes the temperature of the hot reagent solution to return to the set temperature, scales with the amount of the injected cooler reagent solution. Further, Se-ODE is usually prepared at a concentration that is an order of magnitude less concentrated than TOP-Se and as such requires a substantially larger volume of the solution for the same number of moles of selenium. Typically, TOP-Se is prepared at a 1M concentration, while Se-ODE is prepared at a 0.1M concentration. The large volume of Se-ODE that is needed for the same number of moles as in TOP-Se will result in a large temperature drop when the Se-ODE solution is used is the batch hot injection process. Such a large temperature drop is problematic for any nanowire synthesis using the hot injection method.

Three examples of nanowire morphologies grown via a flow process have been reported that all use a similar apparatus. Importantly, none use a continuous flow process, which is a limitation of the apparatus and method design. Essentially, all three conventional methods contain a substrate with attached catalysts. Reagents are flowed across the surface, and nanowires grow out from the surface. The reaction is halted, and the substrate is removed from the reactor and the nanowires are harvested from the substrate.

For example, a conventional method using a flow reactor prepared gold nanoparticles and deposits them on a Si wafer. Each substrate was 5×20 mm, and the flow cell could hold one substrate.[48] The flow technology involved flowing supercritical fluids containing either reagents or solvent over the substrate for some time, then quenching the process and removing the substrate to examine the nanowires. This method also requires specialized chemicals that have the desired properties in the supercritical fluid, and is not generally applicable. A heating block could hold up to 6 reactors, providing some demonstration of scalability. However, the wafer size itself probably is not scalable, as too large a wafer can lead to gradients in chemical precursor concentration as the wires growing on front portion of the wafer consume the reagents and "starve" the wire growth at the back portion of the cell.[49]

Zinc Oxide nanowires were grown using the chemical bath deposition method using a similar apparatus, but using flowing liquid phase, rather than super critical fluid phase. In this example, the catalyst-coated substrate was actually incorporated as one of the walls of the reactor.[49, 50] Again, the reactor would need to be disassembled to remove the product, and the reactor could only be run while catalyst remained on the wall.

Similarly, using a catalyst coated substrate wall was recently reported by the group of Hollingsworth.[51] In this example, a 10×10 mm² squares of bismuth were coated onto a 15×25 mm² Si wafer using electron-beam deposition. The substrate was then assembled into the reactor using a gasket system to attach the substrate to a microfluidic chip. Precursor solutions were then flowed over the heated bismuth substrate. When the reaction was over, the reactor was disassembled and the nanowires on the substrate were removed. Notably, the authors report problems with the solidification of their precursors. In the example, a Cd(TDPA)$_2$ precursor is created using the standard TOPO based preparations. The Cadmium precursor was then diluted with a large volume of TOP, which was reported to prolong the time before the solution solidified, and aided in the flowability. However, this did not prevent solidification, and the solutions had to be heated to ~100° C. to melt them, before loading them in the pumps to flow into the reactor. The authors also report that the feedlines were sometimes heated with a heat gun to prevent solidification of the precursor solutions. The nanowires produced were typically quite short, typically under 1 micron, even at very long reaction times (30 minutes). The nanowires also had a tapered morphology, with one end substantially narrower than the other, and coming to a point.

An apparatus and methods are needed to synthesize high quality nanowires in a flow reaction in larger quantities and results in reproducible, high quality, nanowires.

BRIEF SUMMARY OF THE INVENTION

The present technology includes systems, apparatuses, processes, articles of manufacture, and compositions that relate to semiconductor nanowires. Specifically, the present apparatuses and methods are directed to a continuous flow process using microchannel reactors to produce nanowires.

The disclosure provides an apparatus for producing semiconductor nanowires that may include: 1) one or more pumps for flowing one or more precursor solutions; 2) one or more connectors for combining different precursor solutions in a single channel or conduit; 3) mixing by diverging the channel into a plurality of channels, and converging the plurality of channels in a single channel with a uniform precursor solution that enters a reactor; 4) a reactor having a serpentine or tortuous microchannel and/or macrochannel heated substrate to pass the mixed precursor solution from the connectors through to create and grow semiconductor nanowires. The micro/macro-channel in the heated substrate may further be lined with high temperature micro/macro-channel tubing, for example.

The disclosure also provides a method for continuous flow manufacturing of semiconductor nanowires that includes a mixed reagent precursor solution that may be liquid at room temperature, and contains metal and anion precursors, and catalyst. The catalyst may be formed in situ from a precursor compound.

An example of a continuous flow method for manufacturing semiconductor nanowires may include the following steps: 1) synthesizing an anion precursor to form an anion stock solution; 2) synthesizing a metal precursor to form a metal precursor stock solution; 3) synthesizing a catalyst precursor or catalyst solution; 4) mixing the precursor solutions by using one or more pumps to flow the solutions through one or more connectors; 5) flowing the mixed solution through a reactor at a specific temperature; 6) collecting and washing the product to obtain a purified product.

In an embodiment, the continuous flow method of producing nanowires includes adding a metal precursor solution to a first continuous flow reactor, adding an anion precursor solution to the first continuous flow reactor, and creating a plurality of metal-anion nanowires, wherein the first continuous flow reactor is maintained at a temperature between, and including, 170° C. to 300° C. In an example, the plurality of nanowires are CdSe nanowires. The plurality of nanowires may be Group III-V, II-VI, and IV-VI semiconductor nanowires.

The method may include adding a catalyst precursor solution to the first continuous flow reactor, wherein the third feed line is in fluid communication with the first continuous flow reactor.

In an example, the anion precursor solution includes selenium-octadecene. The anion precursor solution may include selenium-octadecene, selenium-trioctylphosphine, sulfur-octadecene, or sulfur-trioctylphosphine. In another example, the metal precursor includes cadmium or lead. For example, the metal precursor solution includes cadmium, diphenyl ether, octadecene, and trioctylphosphine oxide. In yet another example, at least one of the metal precursor solution and the anion precursor solution include a catalyst precursor solution, wherein the catalyst precursor solution includes bismuth compound in a high boiling point solvent, wherein the high boiling point solvent has a boiling point of greater than, or equal to, 200° C.

The plurality of nanowires may have average diameters between, and including, 2 nm to 70 nm, and wherein the average length of the plurality of nanowires is between, and including, 1 µm to 40 µm.

The method may further include combining the metal precursor solution and the chalcogenide solution in a first single channel of a connector to form a combined solution, wherein the first single channel diverges into a plurality of channels, wherein the plurality of channels converge into a second single channel, wherein the second single channel is flowingly connected to the first continuous flow reactor. In such example, the method may also include mixing the combined solution by pumping the combined solution through the plurality of channels, and recombining the combined solution in the second single channel.

The method may also include adding a coating precursor solution to a second continuous flow reactor, wherein the second continuous flow reactor is in fluid communication with the first continuous flow reactor, wherein the second continuous flow reactor is maintained at a temperature between, and including, 90° C.-250° C. In addition, the method may include pumping the plurality of nanowires from the first continuous flow reactor flow into a second continuous flow reactor, wherein the plurality of nanowires are coated with at least a portion of the decomposed elements of the coating precursor solution to form a plurality of coated nanowires. The coating precursor solution may include zinc diethyl dithiocarbamate. The plurality of coated nanowires may include CdSe/ZnS core/shell nanowires.

The present disclosure also provides a continuous flow apparatus for producing nanowires, wherein the apparatus includes a first feed line and a second feed line. The apparatus also includes a first connector in fluid communication with the first feed line and wherein the first connector is in fluid communication with the second feed line. The apparatus also includes a first continuous flow reactor in fluid communication with the first connector, wherein the first continuous flow reactor is maintained at a temperature between, and including, 170° C. to 300° C.

The apparatus may also include a degassing module, wherein the first connector is in fluid communication with the degassing module, and wherein the degassing module is in fluid communication with the first continuous flow reactor.

The first continuous flow reactor may include at least one reactor channel having a serpentine path, wherein the channel is lined with a high temperature tubing, wherein the diameter of the reactor channel is between, and including, 100 microns to 5 mm, wherein the length of the reactor channel is between, and including, 30 cm to 10000 cm.

In an example, the first connector includes a first single channel that is in fluid communication with the first feed line and the second feed line, wherein the first single channel diverges into a plurality of channels, wherein the plurality of channels converge into a second single channel, wherein the second single channel is connected to the first continuous flow reactor.

The apparatus may include a second continuous flow reactor in fluid communication with the first reactor, wherein the second continuous flow reactor is maintained at a temperature between, and including, 60° C. to 300° C., for example, 90° C. to 250° C.

The apparatus may include a third feed line in fluid communication with a second connector, wherein the second connector is in fluid communication with the first continuous flow reactor and the second continuous flow reactor.

The apparatus may include a pump connected to the first feed line and second feed line, wherein the pump maintains a flow rate of at least 0.001 ml/min through the connector and the first continuous flow reactor.

An advantage of the present apparatuses and methods is providing a synthesis of CdSe nanowires in a continuous flow process using microchannel reactors using reagents that are flowable at room temperature. A continuous flow synthesis method in a microfluidic reactor offers many advantages, which include better control of process parameters, scalability, and automation of production process. Flow reaction also affords a rapid turnover of screening reactions and process parameters, such as residence time, amount of catalyst, metal/anion ratio, can be changed during the production run and product fractions collected for each set of screening parameters. Such rapid screening turnover is not be possible with batch processes as each process can only have a specific limited set of parameters. Flow reactors are extensively scalable; additional units are added in parallel as required, scaling from grams to kilograms to tons.

An advantage of the present methods is using Se-ODE, a stable phosphine-free selenium source, in a reproducible continuous flow synthesis of CdSe nanowires. TOP-Se is more expensive than Se-ODE, requires storage under strictly air-free conditions, and has an age-dependent performance.

An advantage of the present methods is using 1-octadecene and diphenyl ether as co-solvents with TOPO in the synthesis of CdSe nanowires. As a result, the method uses reagent solutions that are flowable at room temperature, the process is extensively scalable, and the properties of the nanowires are comparable to nanowires produced with TOPO alone.

An advantage of the present apparatus and method is allowing for a controlled, reproducible, extensively scalable and low cost nanowire production method.

Another advantage of the present apparatus and methods is providing an easily adjustable modular design, such that the user may customize the nanowires produced.

Further, the apparatus and methods are robust, and may be used to reproducibly synthesize various nanomaterials including but not limited to semiconductor nanowires.

Additional objects, advantages and novel features of the examples will be set forth in part in the description which follows, and in parts will become apparent to those skilled in the art upon examination of the following description and the accompanying drawings or may be learned by production or operation of the examples. The objects and advantages of the concepts may be realized and attained by means of the description, methodologies, instrumentalities and combinations particularly specified in the appended claims.

BRIEF DESCRIPTION OF THE DRAWINGS

The drawing figures depict one or more implementations in accord with the present concepts, exemplified but not limited to the figures by way of example only, not by way of limitations. In the figures, like reference numerals refer to the same or similar elements.

FIG. 6 shows a schematic of yet another embodiment of a flow reactor apparatus according to the disclosure.

FIG. 7 shows a schematic of still another embodiment of a flow reactor apparatus according to the disclosure.

DETAILED DESCRIPTION OF THE INVENTION

Figure 1:
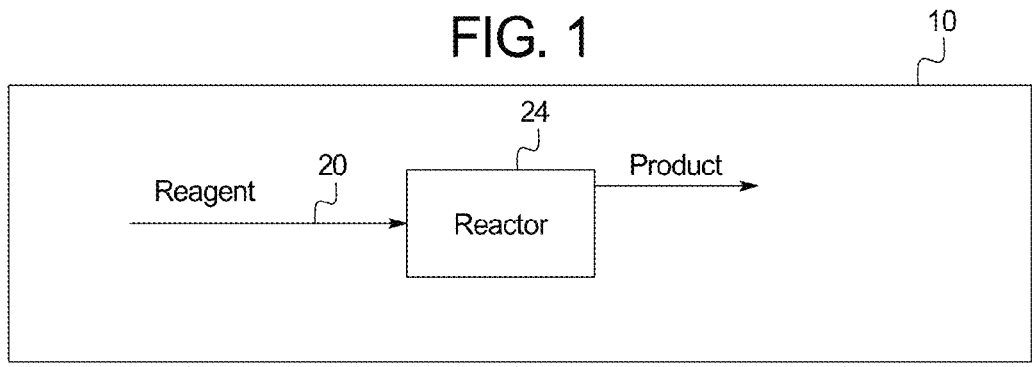
FIG. 1 shows a schematic of an embodiment of a flow reactor according to the present technology.

The present technology relates to various apparatuses and ways of using the apparatuses to fabricate various nanomaterials including semiconductor nanowires. Such nanowires may have lengths greater than or equal to 1 µm, where certain embodiments of nanowires may have lengths of greater than or equal to 10 µm. The nanowires may also have unconstrained lengths. A nanowire may have a diameter on the order of a nanometer ($10^{-9}$ m), and in some embodiments, the thickness or diameter may be several nanometers or even tens of nanometers. The nanowires may exhibit aspect ratios (length-to-width ratios) of 10:1, 100:1, to 1000:1 or more. As such, nanowires are sometimes referred to as one-dimensional (1-D) materials. Specifically, the methods and apparatuses disclosed herein may be used to produce semiconductor nanowires that typically have diameters between, and including, 2-70 nm and lengths between, and including, 1-40 µm.

For example, the present nanowires may have lengths greater than or equal to 1 µm, where certain embodiments of nanowires may have lengths of greater than or equal to 40 µm. The present nanowires may have average lengths of at least 1 µm, at least 5 µm, at least 10 µm, at least 20 µm, at least 30 µm, at least 40 µm, or at least 50 µm. Alternatively, or in addition to, the average length may be less than 100 µm, less than 90 µm, less than 80 µm, less than 70 µm, less than 60 µm, or less than 50 µm. The average length may be defined by any two of the above endpoints. For example, the average length may be between, and including, 1 µm to 50 µm, 5 µm to 20 µm, 10 µm to 50 µm, or 40 µm to 100 µm. The nanowires may also have unconstrained lengths.

The disclosed nanowires may have an average diameter on the order of a nanometer ($10^{-9}$ m), and in some embodiments, the thickness or diameter may be several nanometers or even tens of nanometers. For example, the present nanowires may have an average diameter of at least 1 nm, at least 5 nm, at least 10 nm, at least 20 nm, or at least 30 nm. Alternatively, or in addition to, the nanowires may have an average diameter of less than 100 nm, less than 50 nm, less than 30 nm, less than 10 nm, or less than 5 nm. The average diameter may be defined by any two of the above endpoints. For example, the average diameter may be between, and including, 1 nm to 40 nm, 5 nm to 10 nm, 10 nm to 50 nm, or 5 nm to 30 nm.

The present apparatuses and methods may be used for the production of straight, branched, or straight and branched Group III-V, II-VI, and IV-VI semiconductor nanowires and various semiconductor core-shell nanowire combinations. For example, the methods may be used for the production of straight and branched semiconductor metal-anion nanowires, such as metal-selenide nanowires. In addition, the apparatuses and methods may also be used for the decoration of semiconductor nanowires with metal and/or metal oxide nanoparticles.

The present disclosure provides apparatuses for producing semiconductor nanowires that may include: 1) one or more pumps for flowing one or more precursor solutions and flushing one or more reactors with one or more solvents; 2) one or more connectors for combining different precursor solutions in a single channel; 3) mixing by diverging the channel into a plurality of channels and converging the plurality of channels in a single channel with a uniform precursor solution that enters a reactor; 4) a reactor including a tortuous or serpentine microchannel lined with high temperature non-reactive tubing and heated to a specific temperature between 170° C. and 330° C. through which the mixed uniform precursor solution passes to create and grow semiconductor nanowires.

FIGS. 1-8 show schematics of eight different embodiments of a flow reactor apparatus 10 according to the present disclosure. The apparatuses 10 and methods may include one or more feed lines 20 for receiving reagents. The feed lines 20 may be connected to the mixer 12, a connector 22, and/or a reactor 24.

The simplest embodiment of the apparatus is shown in FIG. 1. Here, a single feed line 20 delivers all reagents to the reactor 24. The apparatus may be used per the procedure in Example 1 to produce nanowires.

Figure 2:
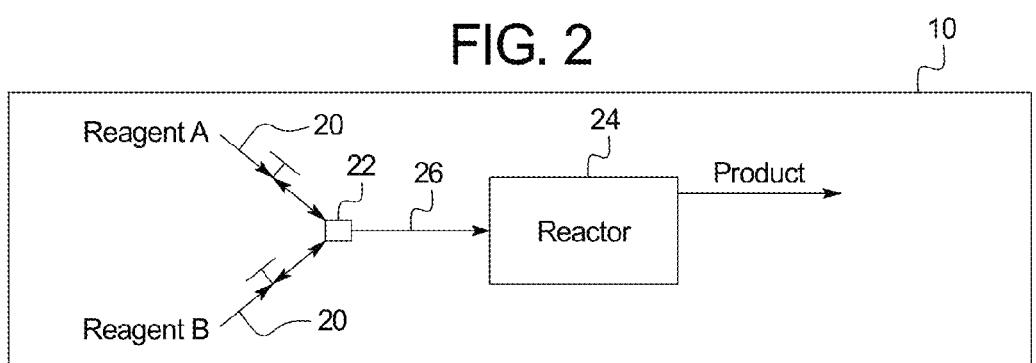
FIG. 2 shows a schematic of another embodiment of a flow reactor apparatus according to the disclosure.

A more robust embodiment of the apparatus is shown in FIG. 2. Here, two separate feed lines 20 combine with connector 22 into a single channel 26, which then feed in to reactor 24. This embodiment can prevent the formation of magic clusters by mixing the reagents immediately before the reactor. The optimal distance between the connector and the reactor can be calculated by using the flow speed and information about the reaction kinetics of the magic clusters. Typically, ten centimeters is sufficient, but if faster magic cluster reactions occur, shorter distances may be used.

In another example, the feed line 20 may direct the reagents into a mixer 12, wherein the mixer 12 includes a first single channel 14 that diverges into a plurality of channels 16 and subsequently converging the plurality of channels 16 into a second single channel 18. However, the mixer 12 may be replaced by other mixers or mixing using a plurality of common mixing methods, where the mixer 12 or method provides a uniform solution after mixing various precursor solutions. The apparatus 10 may include a combination of software and/or hardware for automation of the production, purification and analysis of the product.

The connectors 22 may be separate from the mixer and/or contained within a mixer 12. For example, the solutions from the feed lines 20 may feed into a connector 22 and subsequently enter the mixer 12. The connectors 22 may act as mixers for combining different solutions or suspensions into a single uniform solution or suspension to be introduced to a reactor 24. The connectors 22 mix the different reagents to provide a uniform reagent mixture that is fed to the reactor 24 to remove any concentration gradients that may affect the product quality.

The apparatus 10 may include channels 26 or microtubing that connects and directs the solutions and reagents through the connectors 22, mixers 12, and reactors 24, among others. One or more pumps may maintain reagent flow at a specified or range of pressures or flow speeds through the channels 26 or conduits (e.g., microtubing), connectors 22, and reactors 24. The described pumps provide the hydrodynamic force needed to direct or propel the reagents through the various channels 26 of the apparatus 10. Any pump capable of supplying hydrodynamic flowing force upon a liquid at a designated flow rate may be used.

The one or more continuous flow reactors 24 may maintain a reaction temperature conducive to creating nanomaterials and nanowires and enable further mixing through a serpentine nature of one or more channels 26 therein. In the example of an apparatus 10 including more than one reactor 24, the reactors 24 may be configured in series, in parallel, and combinations thereof. One or more reactors 24 maybe included in the apparatuses 10 that are configured to maintain a reaction temperature and enable further mixing through a serpentine nature of one or more channels therein. The microchannels in the reactor and the microtubing enable fast and effective heat transfer to the reagent solution.

Reactors 24 may include a channel or conduit of a serpentine-shaped glass tube or a coil suspended in a secondary vessel containing a heat transfer fluid to maintain the temperature at a specific value in order to form one or more precursor solutions. The serpentine nature of the reactor channel allows further mixing of the reagents in the reaction zone and this prevents concentration gradients, buildup of residue, and clogging of the reactor 24. In an example, the reactor 24 may include a serpentine heated microchannel substrate maintained at a specific temperature, through which the precursor suspension may be passed to create the precursor solution.

The reactor 24 may be made of a microchannel coil of glass or non-reactive material (e.g., Teflon) suspended in a heat transfer fluid or a heating chamber. The diameter of these channels may include but are not limited to 200 microns to 5 mm. The reactor 24 may include a glass or metal substrate containing the microchannel which may further be lined with a high temperature tubing, e.g., tubing that can withstand temperatures of greater than or equal to 90° C. to 350° C. The diameter of the channels or tubing may range from 100 microns to 5 mm. The lengths of the microchannels in the reactor 24 may be 30 cm to 1000 cm. For embodiments where multiple reactors 24 are used, any combination of the specified reactor designs may be used. The connectors 22 may be used to change the diameter of the channels 26 to the appropriate size for the reactor 24.

In addition, the apparatus 10 may include one or more of the following: 1) a heat source that is programmable or controlled with software; 2) a spectrophotometer for in-line spectroscopic analysis; 3) a pump that is programmable or controlled by software; 4) a purification system for in-line purification of the semiconductor nanowires; 5) a fraction collector to collect the product; 6) software that automates the method by controlling the heat sources, reactors, spectrophotometers, pumps, purification systems, and/or any other programmable component of the apparatus 10.

Various alternative configurations and steps may be used in the present technology. The apparatus 10 may include a separate reactor system for production of the precursor solutions. For example, the apparatus 10 may include separate reactors for the production of cadmium and selenium precursor solutions with the produced solutions mixed with trioctylphosphine and a catalyst precursor solution in a connector 22 and fed into the nanowire reactor 24. In such example, two reactors 24 may be configured in parallel to prepare the separate precursor solutions, then the prepared precursor solutions may be fed into a third reactor 24 in series with the first two precursor reactors 24, to prepare the nanowires.

The precursor solutions produced in the reactor 24 may contain only the metal source, the anion source, such as a chalcogenide source, and/or both the metal and anion sources. The metal and anion precursors may be the same or different chemical compounds. The precursor solution for the reactor 24 may be fed directly by or mixed with other reagents through a mixing system prior to being directed into the reactor 24 for producing semiconductor nanowires.

The semiconductor nanowire solution exiting the reactor may be mixed with precursor solutions and/or introduced into another reactor for the production of coated semiconductor nanowires. The semiconductor nanowire solution exiting the reactor may also be introduced into a purification system for in-line purification of the nanowire product.

FIG. 6 depicts an apparatus 10 wherein two or more reagents are flowingly combined into a single channel 26 using a connector 22 or series of connectors 22. The single channel 26 is flowed through a mixer 12 and then into the reactor 24.

FIG. 7 depicts an apparatus 10 wherein two or more precursor solution feed lines 20 are combined into a single channel 26 using a series of connectors 22. The single channel 26 may flow through a mixer 12 before proceeding into the reactor 24. The product of the first reactor 24 may be passed through a degassing module. The degassed solution may be combined with one or more additional reagent solutions through a separate feed line 20 that may be flowed through a second mixer 12 and a second reactor 24. After the product solution flows through a degassing module 28, the degassed solution may be split into one or more fractions. The fractions may be separately progressed through the second mixer 12 and second reactor 24. The product solution may be subsequently sent through a purification module 30.

Figure 8:
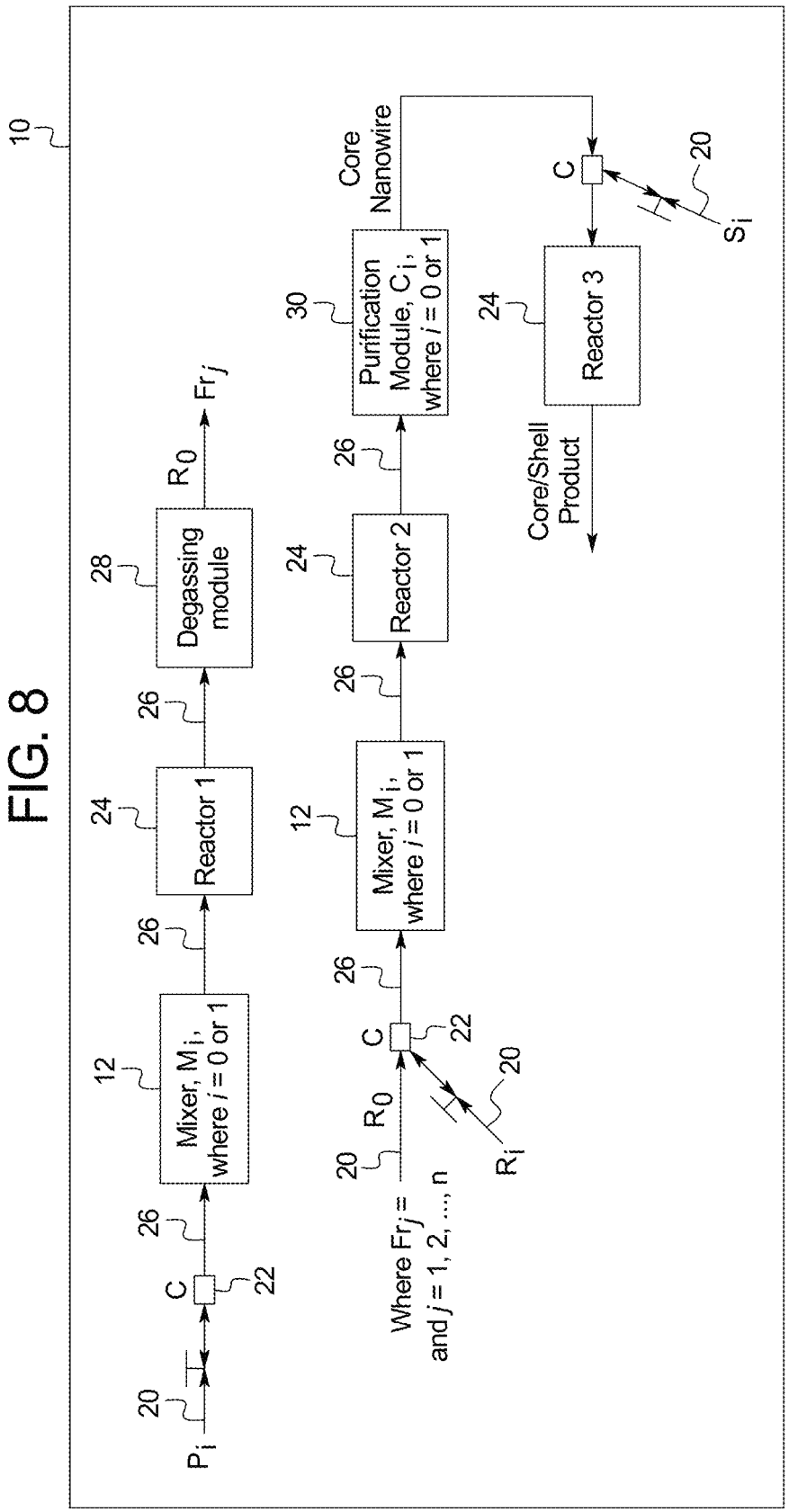
FIG. 8 is a schematic of another embodiment of a flow reactor apparatus disclosed herein.

FIG. 8 is yet another example of the apparatus 10 wherein after the purification module the resulting nanowire product may be coated in a third reactor 24.

The method to use the apparatus 10 involves proper selection of the apparatus configuration and precursor compositions. The number of feedlines 20 is selected by the principle of separating all solutions that might react with each other at room temperature to form unwanted side products before the solutions enter into the reactor(s) 24. The diameters of the channels 26 and reactors 24 are selected based on the physical properties of the solutions. For example, the slurry described in Example 6 dictates the use of larger diameter tubing to produce even flow. The length of the reactor is determined by the residence time desired, and the achievable flow speeds of the pumps that supply the reagents.

The preferred length of the reactor is also determined by the internal diameter of the tubing and by the quality of the produced nanowires. In most reported batch synthesis of nanowires, residence times after injection were in the range of 1-5 min with 2 min being the most reported.[1, 6, 52] Longer residence times generally result in the production of longer nanowires. Further increases in residence times lead to more increases in lengths of the nanowires, which may be accompanied by a broadening of the diameter distribution. We therefore adopted the 2 min residence time in the flow process. Shorter reactor lengths generally favored smoother surface morphology of the flow synthesis nanowires. For example a 2 minute residence time at flow speed of 0.24 ml/min can be achieved with a 100 cm reactor length with a tubing of inner diameter of 0.079375 cm. A 15 hour reaction residence time would require either a flow speed of 0.002 ml/min with a 100 cm reactor and tubing inner diameter of 0.15875 cm, or in the preferred embodiment a flow speed of 0.02 ml/min in a 1000 cm reactor with 0.15875 cm inner diameter.

The ideal precursor solution would be stable and soluble at room temperature for many days. Additionally, it should also be air- and moisture-stable. Less ideal precursor solutions can be handled in the apparatus, by, for example, increasing the diameter of the tubing to reduce the impact of crystallization.

The first precursor required for the flow-SLS production of nanowires is a source of seed particles. The precursor solutions may contain a catalyst, which may be formed in situ from another precursor compound. Alternatively, a catalyst solution or catalyst precursor solution may be added separately through a separate feed line that feeds into the first connector, or a feed line that feeds directly into the first reactor. Catalysts may include bismuth chloride, other compounds containing bismuth or other suitable metals, premade nanoparticles of bismuth or other suitable metals, premade metal nanoparticles containing a bismuth coating, or combinations thereof, among others. The catalysts may include other suitable metals, such as gold, indium, or silver [53-55] or other metals that possess such form molten droplets near the nanowire synthesis temperature The premade seed particles may be added to either precursor solution or introduced via a separate feedline with diluents such as octadecene or diphenyl ether or another high boiling point solvent, or combination of high boiling point solvents.

The seed particles may be made in situ. In a typical reaction, bismuth chloride may be used in a high boiling point solvent such as N-methyl-2-pyrrolidinone (NMP) to provide a bismuth source for the in situ formation bismuth seed particles upon reaction with a reducing agent (e.g. oleylamine or trioctylphosphine). Alternatively, a solution of triphenylbismuth in 1-octadecene or diphenyl ether may be used to provide a bismuth source. Other solutions containing bismuth compounds may be used for this purpose. However, the present apparatus and methods have demonstrated that high boiling point solvents, such as 1-methyl-2-pyrrolidinone (NMP), or 1-octadecene, may be used to provide a bismuth source in a flow reaction method. The metal seed particle precursor can also be delivered in a solution of amines, such as bismuth chloride in oleylamine.

In contrast, conventional nanowires grown by the hot injection solution-liquid-solid method may be created from either pre-made bismuth seed particles or bismuth chloride in a low boiling point solvent such as acetone. Low boiling point solvents were once thought to be essential for the formation of bismuth seed particles. For example, the introduction of low boiling point solvents into a hot reaction mixture leads to rapid evaporation of the low boiling point solvent, resulting in a rapid increase in the bismuth concentration which was thought to be critical for rapid formation of bismuth seed particles. Low boiling point solvents were also conventionally used because bismuth chloride is soluble in certain low boiling point solvents, and bismuth chloride has low solubility or is insoluble in many solvents.

There are several advantages of the present method of using high boiling point solvents over the conventional method (e.g., solvents having a boiling point greater than or equal to the reaction temperature, for example, solvents with boiling points greater than or equal to 150° C., greater than or equal to 200° C., greater than or equal to 250° C., or greater than or equal to 300° C.). Low boiling point solvents may immediately vaporize upon entering the reactor 24, if the reactor is held at a temperature higher than the boiling point. The vapor produces gas bubbles in the channels or microtubing 26 and disrupts the flow and consequently the production of nanowires. Similarly, the wide range of metal seed precursor solutions developed herein allows the user to select a metal seed precursor solution that is miscible with the other solutions. This improves mass transport and the homogeneity of the product. The conventional solution of $BiCl_3$ in acetone is a slurry or suspension, which may mean that the concentration of $BiCl_3$ changes with time, and especially in the flow reaction, as $BiCl_3$ particles settle out of solution and no longer are flowable. Additionally, extremely volatile solvents such as acetone mean the metal seed particle precursor solution must be made freshly each time, as the concentration of the solution will change during storage as the acetone evaporates. High boiling point solvents allow the long-term storage of the precursor solution without changes in concentration.

The next precursor solution is the metal source. This is typically synthesized as a metal-fatty acid, metal-alkylphosphinic acid, or metal-alkyl amine complex. Other metal-containing compounds that are capable of delivery of the metal in a soluble reactive form may be used as a metal source. For example soluble metal/fatty acid precursors may be used in the method and apparatus disclosed herein to produce CdSe, CdS or PbSe. However, standard preparations of metal/fatty acid precursors in the synthesis of Cadmium chalogenide[4, 6, 51, 52] and lead chalcogenide[15] nanowires are not soluble at room temperature and typically precipitate in the microchannel. Optimizing the metal/fatty acid reagent solution to provide a room temperature soluble material is important for successful production of good quality straight nanowires. Branched and kinked morphologies may not require soluble metal/fatty acid precursors.

In an example, the metal/fatty acid precursor for Cd-chalogenide nanowire synthesis may include combinations such as cadmium oxide (CdO)/oleic acid, CdO/stearic acid, CdO/octanoic acid, CdO/myristic acid, etc. Cadmium acetate or other commercially available cadmium compounds may be used in place of cadmium oxide. The metal/fatty acid precursor may be formed at high temperatures to aid in solubility. In the example of cadmium/fatty acid, soluble complexes may form at temperatures in the range of 230° C.-350° C. depending on the cadmium/fatty acid combination. To obtain cadmium/fatty acid precursor that are soluble at room temperature, the composition of the cadmium precursor solution may be optimized by adding 1-octadecene and diphenyl ether as co-solvents with TOPO. Diphenyl ether when used as a co-solvent with TOPO and octadecene improves the quality of the CdSe nanowires compared to when 1-octadecene is used as a co-solvent. The reason behind this effect is unknown, but may be linked to the weakly coordinating nature of the diphenyl ether. Diphenyl ether also may help produce a soluble solution due to its more polar nature than 1-octadecene. However, diphenyl ether as the only co-solvent may result in irreproducible solubilities of the cadmium precursor solution at room temperature as the reagent solution freezes which is due, in part, to its melting point. When 1-octadecene and diphenyl ether are used as co-solvents with TOPO in our cadmium precursor solution, the cadmium precursor solution is reproducibly soluble at room temperature and high quality CdSe nanowires are produced. Specific examples of such may be found in Examples 1-3 (CdSe nanowires) and Example 7 (CdS nanowires).

In another example, the metal/fatty acid precursor for CdSe nanowire synthesis may include combinations such as cadmium oxide (CdO)/oleic acid, CdO/stearic acid, CdO/octanoic acid, CdO/myristic acid, etc. Cadmium acetate or other commercially available cadmium compounds may be used in place of cadmium oxide. The metal/fatty acid precursor may be formed at high temperatures to aid in solubility. In the example of cadmium/fatty acid, soluble complexes may form at temperatures in the range of 230° C.-350° C. depending on the cadmium/fatty acid combination. To obtain cadmium/fatty acid precursor that is soluble at room temperature, the composition of the cadmium precursor solution may be optimized by adding 1-octadecene and diphenyl ether as co-solvents with TOPO. Specific examples of such may be found in Example 1-3.

In another example, the metal/fatty acid precursor for PbSe nanowire synthesis may include combinations such as lead oxide (PbO)/oleic acid, PbO/stearic acid, PbO/octanoic acid, PbO/myristic acid, etc. lead acetate or other commercially available lead compounds may be used in place of cadmium oxide. The metal/fatty acid precursor may be formed at high temperatures to aid in solubility. In the example of lead/fatty acid, soluble complexes may form at temperatures in the range of 120° C.-150° C. depending on the lead/fatty acid combination. To obtain lead/fatty acid precursor that is soluble at room temperature, the composition of the lead precursor solution may be optimized by adding 1-octadecene or diphenyl ether as co-solvents with trioctylphosphine. Specific example of such may be found in Examples 4

These metal precursors may either be pre-synthesized and then loaded in to the apparatus 10, or they may be made with the apparatus 10. In an example, a configuration such as that shown in FIG. 7 may be selected. The Reactor 1 would be selected to synthesize the metal precursor, and the resulting solution degassed via module 28. The formation of the metal precursor is known to produce gas and vapors that should be removed prior to nanowire synthesis.[56] A specific example of a cadmium oleate precursor synthesized in the apparatus and then used to produce nanowires in the apparatus is presented in Example 6.

The anion precursor solution is typically synthesized as an anion-fatty acid, anion-alkylphosphinic acid, anion-alkyl amine or anion-alkylphosphine complex. Other anion-containing compounds that are capable of delivery the anion in a soluble reactive form may be used as the anion source. For the specific example of chalogenide anions (E=S, Se, Te), the preferred embodiments are alkylphosphine-E and octadecene-E complexes. Examples are presented where both trioctylphosphine (Ex. 1 & 7) and octadecene (Ex. 2-6) are used to create chalcogenide precursors. As with the metal precursor, the anion precursors can be made either external to the apparatus and then loaded to the apparatus, or can be synthesized in the apparatus in the configuration demonstrated in FIG. 7.

In the specific example of Se-ODE, it is remarkably stable and may be flowed for long hours and in large volumes without any noticeable changes in the nanowire product. Se-ODE may be prepared in a concentration that is an order of magnitude more dilute than a conventional TOP-Se solution and, as such, Se-ODE may be flowed without dilution through a separate feed line from the metal precursor line without affecting the product quality.

Se-ODE may not be suitable for conventional hot injection methods of producing nanowires. For example, the large temperature drop that may accompany the hot injection of Se-ODE may adversely affect the product quality in a batch process. Depending on the metal/anion ratio and the consequent volume ratio of the metal precursor solution to the Se-ODE solution, the volume of the Se-ODE may be such as to cause a catastrophic drop in temperature that renders the synthesis impossible. In contrast, the flow reactor method disclosed herein avoids the temperature drop by incorporating microchannel reactors wherein fast and efficient heat transfer to the reagent solution results in the near-immediate rise of the reagent temperature to the set process temperature.

In the reactor and for the specific example of metal chalcogenide nanowires, the octadecene-chalcogenide precursor may react with the metal precursor at a high temperature in the presence of the catalyst and other reagents to form metal chalcogenide nanowires. The selectivity of the selenium precursor solution towards nanowire production may be tuned with trioctylphosphine to give the desired product morphology. For example, as demonstrated in Examples 2 & 3, trioctylphosphine is added to improve the yield of the CdSe nanowires and in Example 4, trioctylphosphine improves the yield of PbSe nanowires. Higher amounts of trioctylphosphine in the CdSe production process using Se-ODE as the selenium source can result in CdSe nanowires with uneven surfaces.

The present continuous flow method of producing CdSe nanowires using Se-ODE as the selenium source produces superior nanowires. For example, when Se-ODE is used as the selenium source, high quality, straight CdSe nanowires with diameters between, and including, 5 nm to 30 nm were produced in the flow reactor.

In another example, the alkylphosphine, such as trioctylphosphine, can be used to synthesize chalcogenide precursor. Example 1 demonstrates the use of TOP-Se and Example 7 demonstrates the use of TOP-S.

In an example, the method may include combining at least two precursor solutions in a first connector. For example a soluble metal/fatty acid precursor solution, such as a cadmium precursor solution, may be added to a first feed line and a selenium precursor solution may be added to a second feed line. The two precursor solutions may be mixed in a connector and fed into a reactor disclosed herein whereby CdSe nanowires are produced. The method may include an additional separate feed line for a catalyst precursor solution, among others, to be added.

The apparatus and method may include separate feed lines for a selenium precursor solution, trioctylphosphine, a catalyst precursor solution, and a cadmium precursor solution, which are mixed in the connector and fed to the reactor. Alternatively, or in addition to, the apparatus and method may include separate feed lines for the cadmium and selenium precursor solutions which are mixed in a first connector, a separate feed line for the trioctylphosphine, and a separate feed line for the catalyst precursor solution, wherein the solution from the first connector is mixed with the trioctylphosphine and catalyst precursor solution in a second connector and fed to the reactor.

Yet another example of the method and apparatus may include separate feed lines for the cadmium precursor solution and trioctylphosphine which are mixed in a first connector, separate feed lines for the selenium and catalyst precursor solution which are mixed in a second connector, wherein the solutions from the two connectors are mixed in a third connector and fed into the reactor. In another example, the method and apparatus include separate feed lines for the cadmium precursor solution and catalyst precursor solution that are mixed in a first connector, separate feed lines for the selenium precursor solution and trioctylphosphine which are mixed with the solution from the first connector in a second connector and fed to the reactor. In an example, separate feed lines for the cadmium precursor solution and trioctylphosphine are mixed in a first connector, separate feed lines for the selenium and catalyst precursor solution are mixed with the solution from the first connector in a second connector and fed into the reactor. The methods and apparatus may include separate feed lines for heat transfer fluids or solvents to change the concentration of the reagents and thus tune the product.

In contrast to conventional methods of producing CdSe nanowires using the hot injection method, in the present apparatuses and methods, the reagents may be mixed at low temperatures and introduced in the reactor where fast heat transfer leads to the exclusive production of nanowires at the desired temperature. Methods may include a cadmium precursor suspension degassing temperature in the range of 60-120° C. The cadmium precursor solution formation temperature may be in the range of 210° C.-350° C., for example, 230° C.-330° C., 220° C.-300° C., or 240° C.-270° C. A selenium precursor solution formation temperature may be between, and including, 180° C.-280° C. with a formation time in the range of 10 minutes to 5 hours. For example, the selenium precursor solution may be formed at a temperature between, and including, 180° C.-280° C., 180° C.-260° C., 180° C.-240° C., or 180° C.-220° C. The nanowire production temperature may be in the range of 170° C.-330° C., for example, 180° C.-300° C., 170° C.-280° C., 220° C.-300° C., or 170° C.-260° C.

The reactivity of the metal chalcogenide may also be tuned by the addition of dioctylphosphinic acid, tetradecylphosphonic acid, oleylamine, or any other compound containing similar functional groups. For example, addition of oleylamine appears to speed up reaction kinetics, producing larger diameter wires. Addition of tetradecylphosphonic acid slows down the reaction kinetics and produces nanowires with much shorter lengths (1 micron) compared to conditions without tetradecylphosphonic acid. Excess dioctylphosphinic acid in the reaction mixture has a similar effect. Those skilled in the art will recognize that reaction kinetics can also be altered by changing the concentration of the reagents, and this can also be used to alter the nature of the product.

This apparatus and the method of use are also well suited to screening a variety of reaction conditions. An example is a single flow process where the metal/anion ratio, catalyst amount, residence time, reagent concentration, process temperature, etc. can be screened during the duration of the flow process. As a specific example, a nanowire flow production may have three reagent feed lines A, B, and C (Examples 3 and 4) containing metal, chalcogenide, and catalyst precursor solutions, respectively. Various combinations of residence time, metal/chalcogenide ratio, catalyst amount, and process temperature, can be achieved and fractions collected for each set of screening parameters for analysis. A larger number of feed lines with broaden the number of possible combinations of screening conditions. This type of rapid combinatorial screening is not easily achievable with batch reactions. This technique is very useful for the development of novel nanomaterials, but also for gaining a deeper understanding into the fundamental principles behind the formation of known nanomaterials. A high throughput robotic batch reactor has been reported that can perform eight small scale hot injection reactions at a time.[11] With the apparatus 10 and methods herein, a near infinite number of reaction conditions can be screened in a reaction run.

The present apparatuses and methods for making nanomaterials including semiconductor nanowires may be used in various ways and in various systems and devices to provide certain benefits and advantages. Nanowire uses include nanoscale electronics, optoelectronics, chemical sensors, biological sensors, optical sensors, polarization sensors, energy harvesting and storage, flexible electronics, photocatalysis, printed electronics, solar cells, and gas sensors among others. For example, the unique optical, electronic, and physio-mechanical properties of the semiconductor nanowires may improve the performance of such systems and devices. An example photosensor device was produced from these CdSe NWs and the results presented in FIG. 16.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions and methods may be made within the scope of the present technology, with substantially similar results.

Example 1

Materials. 1-methyl-2-pyrrolidinone (99.5%, Aldrich), 1-octadecene (90%, Aldrich), acetonitrile (99.9%, Fisher Chemical), $BiCl_3$ (99.999%, Strem), CdO (99.5%, Aldrich), diphenyl ether (99%, Aldrich), methanol (ACS grade, VWR), oleic acid (90%, Aldrich), oleylamine (70% Aldrich), selenium (99.99%, Strem) trioctylphosphine (90%, Aldrich), trioctylphosphine oxide (99%, Strem), toluene (ACS grade, VWR). 1M TOP-Se was prepared by dissolving selenium powder in trioctylphosphine under inert atmosphere; trioctylphosphine oxide (TOPO) was recrystallized from acetonitrile prior to use; di-n-octylphosphinic acid (DOPA) was synthesized according to the procedure reported by Wang et. al.[1], a stock suspension of 2 mM $BiCl_3$ in NMP was prepared in advance.

The continuous flow reactor for nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. Connections to the tubing were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of CdSe Nanowires using TOP-Se as a selenium source. CdO (60 mg), DOPA (100 mg), oleic acid (0.8 ml), TOPO (2.5 g) and 1-octadecene (1.0 ml) were degassed for 1 hr in a 3-neck round bottom flask at 80° C. The temperature was then raised to 300° C. under nitrogen atmosphere until it turned clear indicating the complete formation of cadmium oleate. The temperature was lowered to 60° C. and diphenyl ether (1.6 ml) and oleylamine (1.7 ml) were added followed by degassing the mixture at this temperature for 30 min, then cooled to room temperature under nitrogen atmosphere. 1M TOP-Se (0.1 ml) and 2 mM $BiCl_3$ suspension (0.2 ml) was added to the reaction mixture.

The reactor configuration follows FIG. 2. Separately, the reactor was preheated to 250° C. on a hotplate while flowing 1-octadecene from a syringe pumps through it. The temperature of the reactor was monitored using external temperature probes. When the reactor temperature stabilized at 250° C., the reagent was then added to a syringe and flowed through the reactor at 0.239 mL/min to give a 2 min residence time at 250° C. process temperature. The nanowire products were collected in a collection vessel downstream from the reactor and purified by conventional CdSe nanowire purification techniques.

Figure 9A:
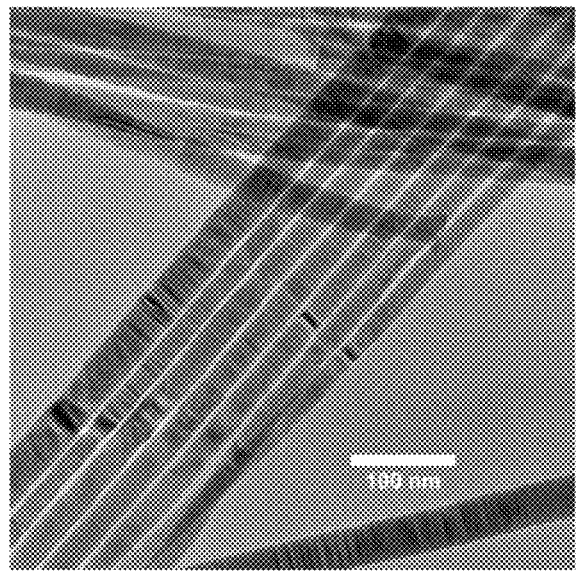
FIGS. 9a-9b shows TEM images of bare CdSe nanowires according to the procedure of Example 1. The scale bars are equal to 100 nm.
Figure 9B:
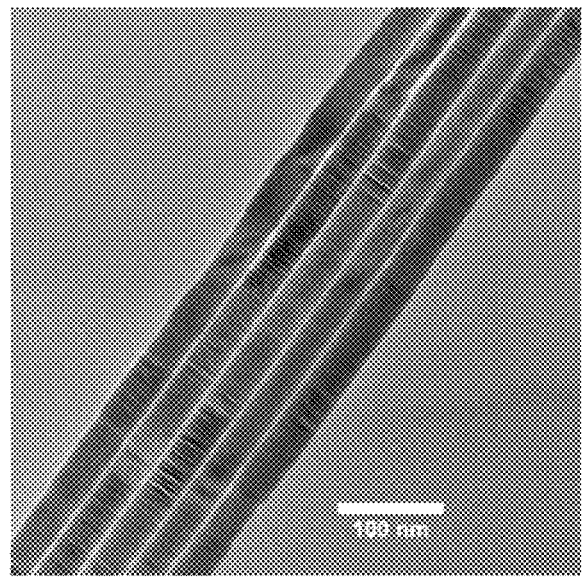

FIGS. 9a-9b include TEM images of the CdSe nanowires synthesized according to Example 1 having an average diameter of 25.83 nm (σ=±26%).

Figure 10A:
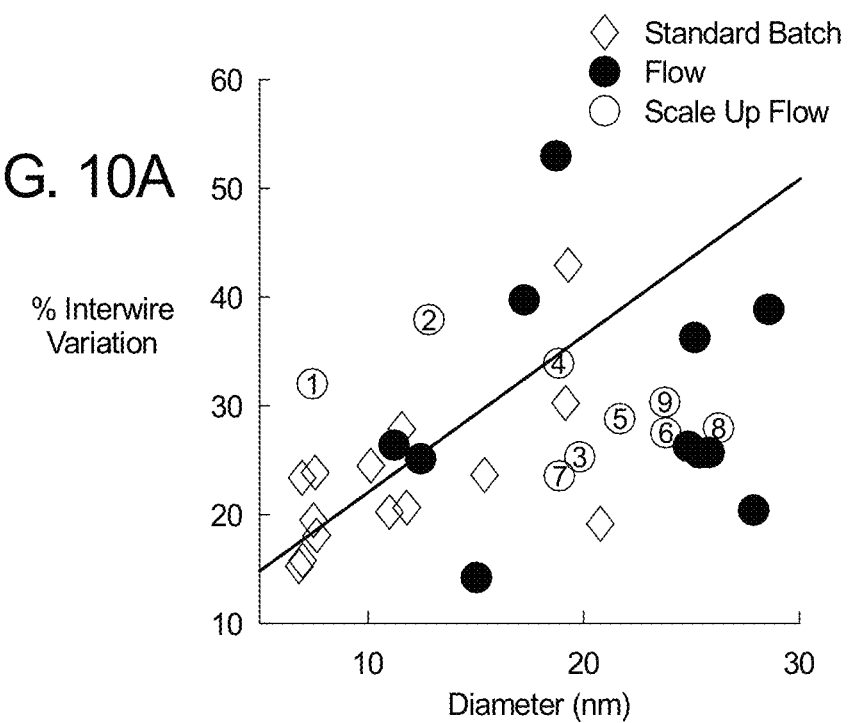
FIG. 10a compares the interwire diameter variation of an optimized standard batch reaction with various flow reactions made according to the procedure of Example 1.
Figure 10B:
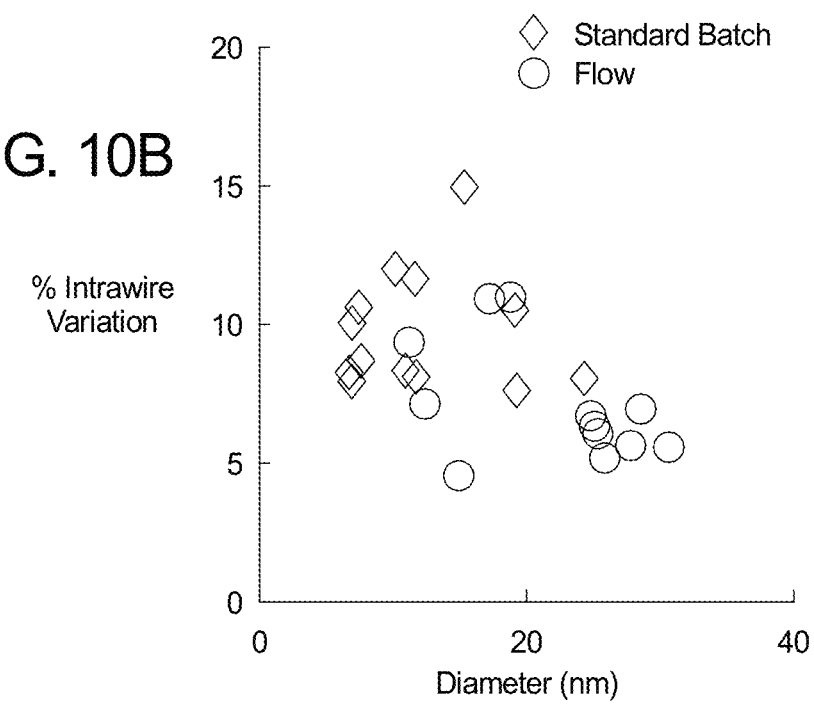
FIG. 10b compares the intrawire diameter variation of an optimized standard batch reaction with various flow reactions made according to the procedure of Example 1.

FIGS. 10a-10b compare flow reactions of this type with optimized batch preparations. Typically 40-100 wires are measured per synthesis via TEM. Each wire is measured at 10 places along its length, and these data are used to calculate average diameter and variance. The graph on the left displays size variance among wires within the same lot, while the graph on the right shows average variance within a single wire of that lot. FIGS. 10a-10b compare an optimized standard batch [2, 57] reaction (diamonds), with various flow reactions we performed. It has been reported that the interwire variation increases with diameter, [52] and a linear fit of the optimized batch data is shown as a guide to the eye, FIG. 10a (line). The flow reactions (circles) typically give better inter- and intra-wire distributions than the corresponding batch reactions (diamonds).

Figure 11A:
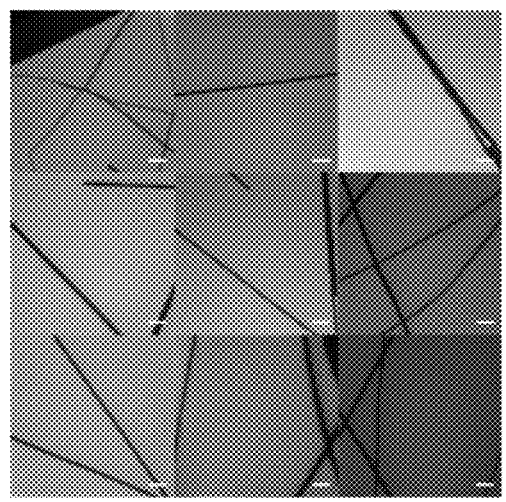
FIG. 11a shows TEM images of CdSe nanowires from a scaled-up version of a flow reaction of made according to the procedure of Example 1. The scale bars are equal to 100 nm.
Figure 11B:
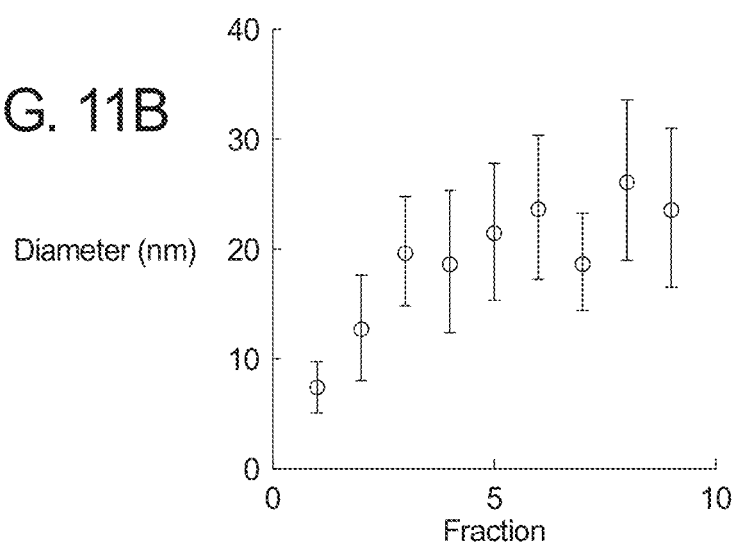
FIG. 11b shows the diameter results of a scaled-up version of a flow reaction of made according to the procedure of Example 1.
Figure 11C:
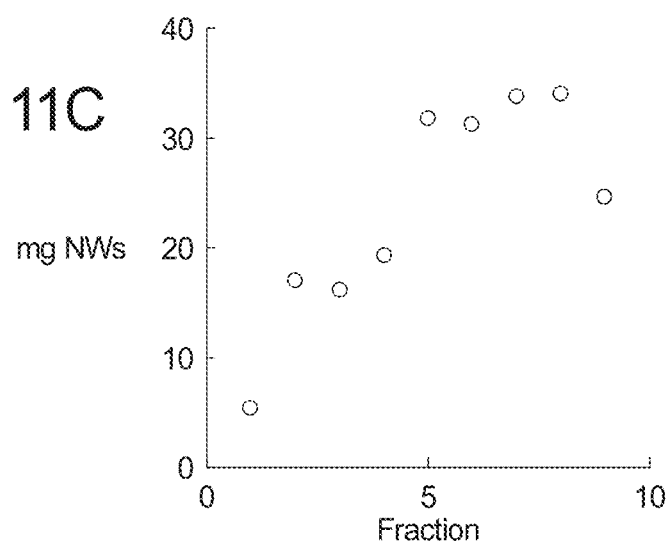
FIG. 11c shows the yield results of a scaled-up version of a flow reaction of made according to the procedure of Example 1.

This type of reaction has also been performed on a large scale; over the course of ~9 hours consistent product was manufactured, as shown in the TEM images in FIG. 11a. An air bubble was discovered in the line for the first fraction, which was cleared and the run restarted; thus the first two fractions are expected to be slightly different due to the air and the stopped flow. The last fraction was also a partial hour. As shown in FIG. 11b, the remaining fractions are consistent in diameter (d=22 nm±6.9 nm, n=592 wires). They exhibited a similar distribution compared to short flow reaction runs (~30% interwire variation for 25 nm wires), but tighter than batch reactions (~45% interwire variation for 20 nm wires). The interwire variation is shown by fraction in FIG. 10a (numbered circles). FIG. 11c shows that each fraction reliably produced at least 30 mg of NWs (discounting the interrupted flow in the first two fractions and the partial hour run time of the last fraction).

Example 2

Materials. 1-methyl-2-pyrrolidinone (99.5%, Aldrich), 1-octadecene (90%, Aldrich), acetonitrile (99.9%, Fisher Chemical), $BiCl_3$ (99.999%, Strem), CdO (99.5%, Aldrich), diphenyl ether (99%, Aldrich), methanol (ACS grade, VWR), oleic acid (90%, Aldrich), oleylamine (70% Aldrich), selenium (99.99%, Strem), trioctylphosphine (90%, Aldrich), trioctylphosphine oxide (99%, Strem), toluene (ACS grade, VWR). 0.1M Se-ODE was prepared by dissolving selenium powder in 1-octadecene at 180° C. for 5 hr under inert atmosphere according to the procedure by Bullen et al. [42]; trioctylphosphine oxide (TOPO) was recrystallized from acetonitrile prior to use; di-n-octylphosphinic acid (DOPA) was synthesized according to the procedure reported by Wang et al. [1], a stock suspension of 2 mM $BiCl_3$ in NMP was prepared in advance.

The continuous flow reactor for nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. Connections to the tubing were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of CdSe Nanowires using Se-ODE as a selenium source. CdO (60 mg), DOPA (12 mg), oleic acid (0.8 ml), TOPO (2.5 g), and 1-octadecene (1.0 ml) were degassed for 1 hr in a 3-neck round bottom flask at 80° C. The temperature was then raised to 300° C. under nitrogen atmosphere until it turned clear indicating the formation of cadmium oleate. The temperature was lowered to 80° C. and diphenyl ether (1.6 ml) was added followed by degassing the mixture at this temperature for 30 min, then cooled to room temperature under nitrogen atmosphere. A second reaction mixture of identical composition was prepared in parallel. Trioctylphosphine (0.05 ml) was added to the first reaction mixture (Reagent A), 2 mM $BiCl_3$ suspension (0.035 ml) and 0.1M Se-ODE (2.0 ml) were added to the second reaction mixture (Reagent B).

The reactor configuration follows FIG. 2. Separately, the reactor was preheated to 240° C. on a hotplate while flowing 1-octadecene from two syringe pumps through it. The two flow lines were combined using a T-connector into a single line that enters the reactor, and the temperature of the reactor was monitored using external temperature probes. When the reactor temperature stabilized at 240° C., the two Reagents A and B were then added to two different syringes and flowed through the reactor at 0.1024 and 0.1366 mL/min, respectively, to give a 2 min residence time. The nanowire products were collected in a collection vessel downstream from the reactor and purified by conventional CdSe nanowire purification techniques.

Figure 12A:
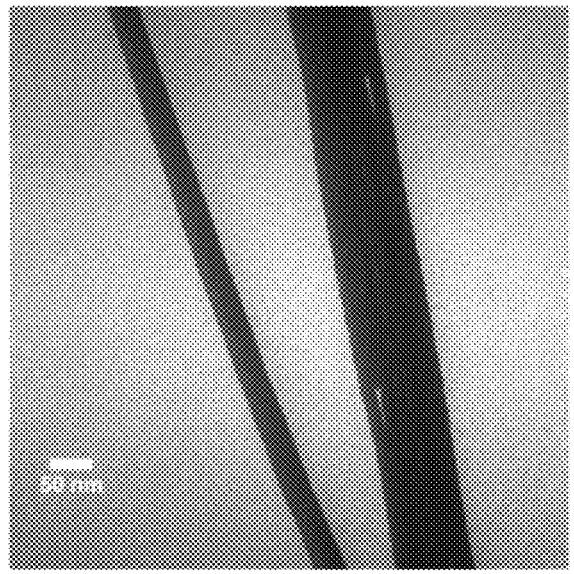
FIGS. 12a-12b are TEM images of CdSe nanowires according to the procedure of Example 2.
Figure 12B:
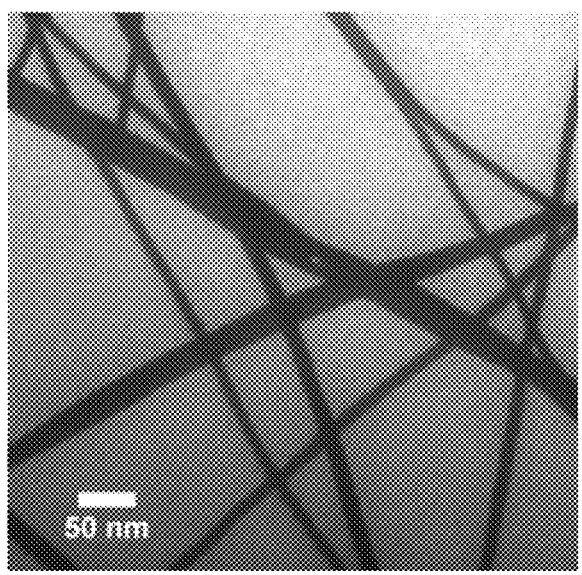

FIGS. 12a-12b include TEM images of the CdSe nanowires synthesized according to Example 2 and having an average diameter of 9.98 nm (6=±27%).

Figure 13A:
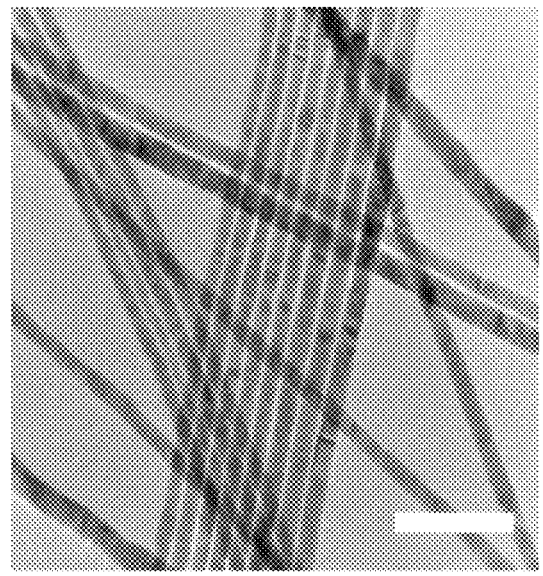
FIGS. 13a-13b are TEM images of CdSe nanowires having 10 nm diameters using Se-ODE as the selenium source. The average diameters are 11.7±3.7 nm. The scale bars are equal to 100 nm.
Figure 13B:
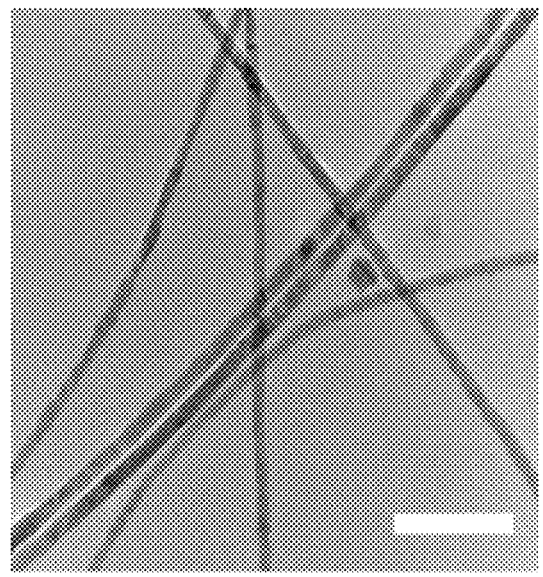

FIGS. 13a-13b are TEM images of the CdSe nanowires synthesized according to modification of Example 2. The modifications implemented are: 0.1M Se-ODE (1.0 ml) and 2 mM $BiCl_3$ in NMP (0.040 ml). The nanowires have an average diameter of 11.7 nm (σ=±31%).

Example 3

Materials. 1-methyl-2-pyrrolidinone (99.5%, Aldrich), 1-octadecene (90%, Aldrich), acetonitrile (99.9%, Fisher Chemical), triphenylbismuth (99%, Strem), CdO (99.5%, Aldrich), diphenyl ether (99%, Aldrich), methanol (ACS grade, VWR), oleic acid (90%, Aldrich), oleylamine (70% Aldrich), selenium (99.99%, Strem), trioctylphosphine (90%, Aldrich), trioctylphosphine oxide (99%, Strem), toluene (ACS grade, VWR). 0.2M Se-ODE was prepared by dissolving selenium powder in 1-octadecene at 200° C. for 2 hr under inert atmosphere according to the procedure by Bullen et al.[42]; trioctylphosphine oxide (TOPO) was recrystallized from acetonitrile prior to use; di-n-octylphosphinic acid (DOPA) was synthesized according to the procedure reported by Wang et al.[1]; a stock suspension of 2 mM triphenylbismuth ($BiPh_3$) in 1-octadecene was prepared in advance.

The continuous flow reactor for nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. Connections to the tubing were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of CdSe Nanowires using Se-ODE as a selenium source. CdO (60 mg), DOPA (12 mg), oleic acid (0.8 ml), TOPO (2.5 g), 1-octadecene (1.0 ml), and diphenyl ether (1.6 ml) were degassed for 1 hr in a 3-neck round bottom flask at 80° C. The temperature was then raised to 300° C. under nitrogen atmosphere until it turned clear indicating the formation of cadmium oleate. The mixture was cooled to room temperature under nitrogen atmosphere. Trioctylphosphine (0.12 ml) was added to this reaction mixture (Reagent A). 0.2M Se-ODE (2.35 ml) and 2 mM $BiPh_3$ suspension (0.05 ml) were mixed under nitrogen (Reagent B). 1-octadecene (7.0 ml) (Reagent C) and all the other reagents (A & B) were added to separate syringes.

Figure 3:
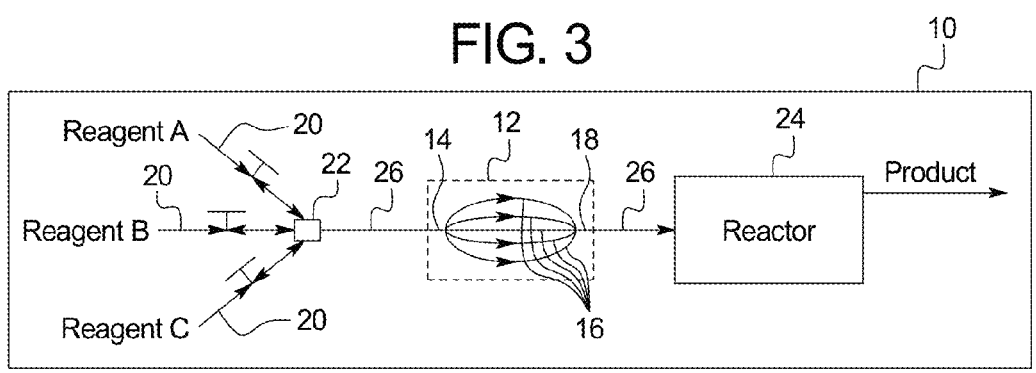
FIG. 3 shows a schematic of a further embodiment of a flow reactor apparatus according to the disclosure.
Figure 4:
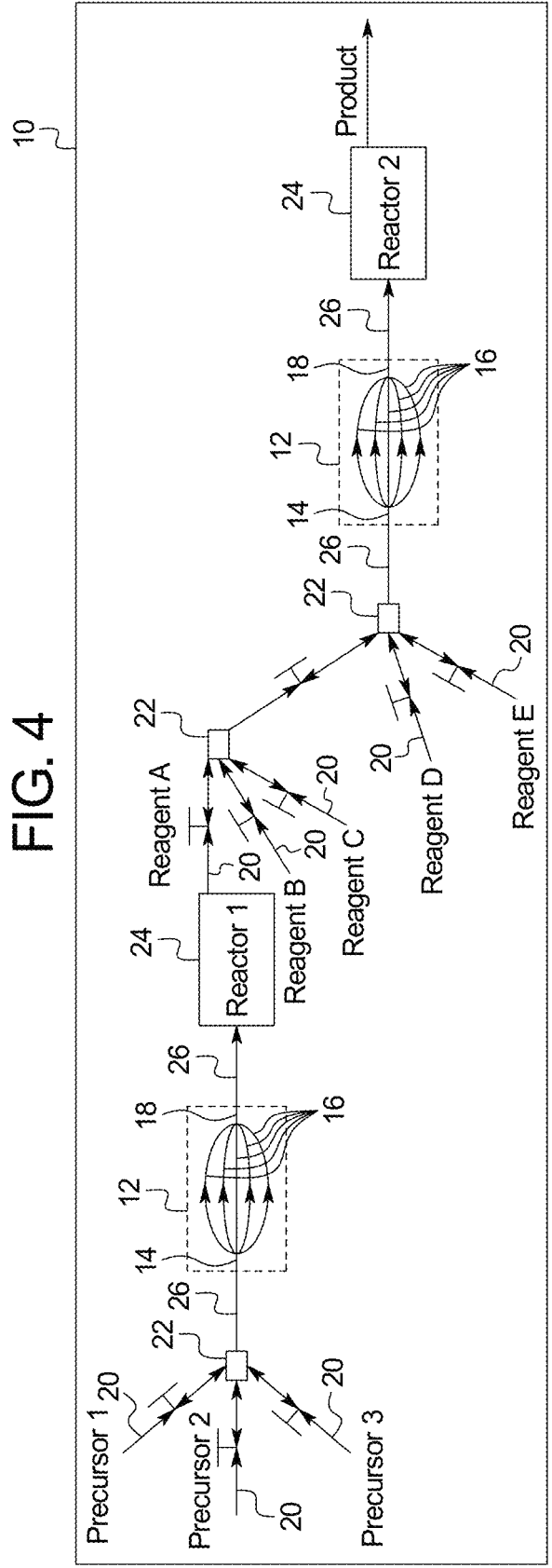
FIG. 4 shows a schematic of yet another embodiment of a flow reactor apparatus according to the disclosure.
Figure 5:
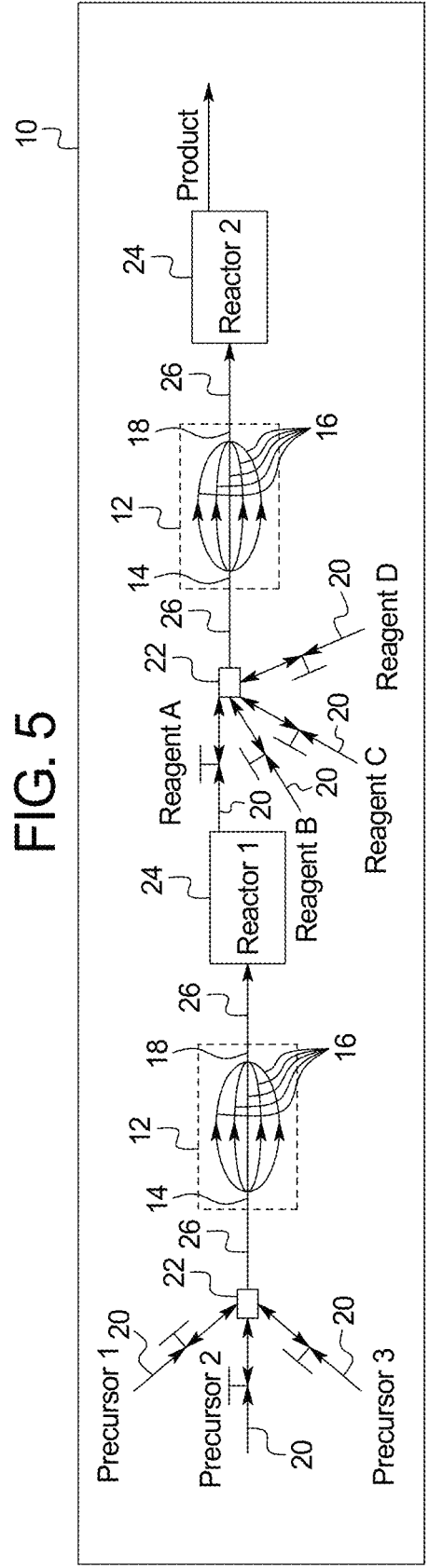
FIG. 5 shows a schematic of still another embodiment of a flow reactor apparatus according to the disclosure.

The reactor configuration follows FIG. 3, however, without the mixer. Separately, the reactor was preheated to 240° C. on a hotplate while flowing 1-octadecene from three syringe pumps through it. The three flow lines were combined using a cross-connector into a single line that enters the reactor, and the temperature of the reactor was monitored using external temperature probes. When the reactor temperature stabilized at 240° C., the three Reagents A, B and C were flowed through the reactor at 0.0978, 0.0361, and 0.1051 mL/min, respectively, to give a 2 min residence time. The nanowire products were collected in a collection vessel downstream from the reactor and purified by conventional CdSe nanowire purification techniques.

Figure 14A:
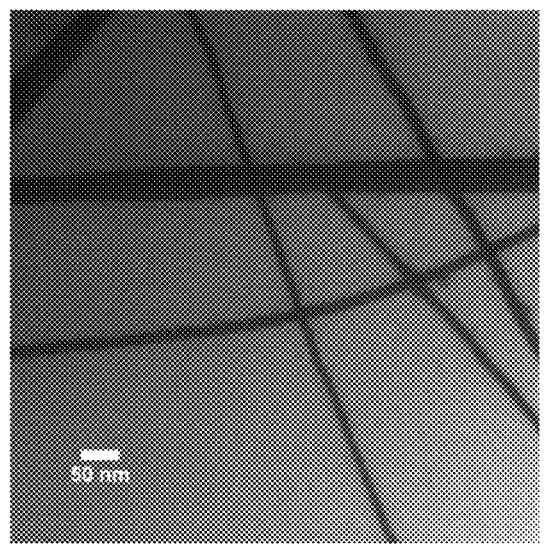
FIGS. 14a-14b are TEM images of CdSe nanowires made according to the procedure of Example 3. The scale bars are equal to 50 nm.
Figure 14B:
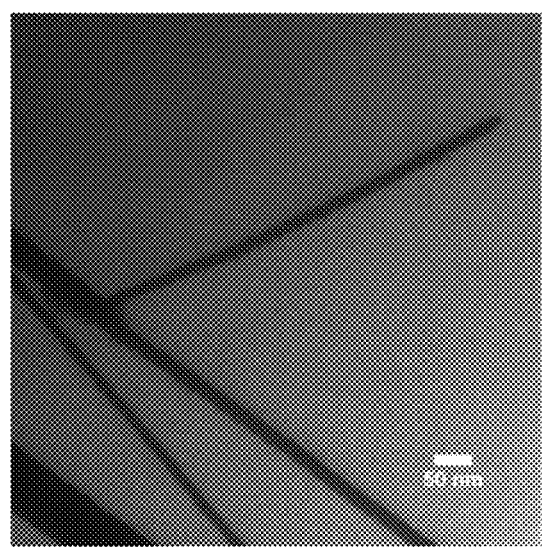

FIGS. 14a-14b include TEM images of the CdSe nanowires synthesized according to Example 3 and having an average diameter of 15.5 nm (σ=±20%).

Figure 15:
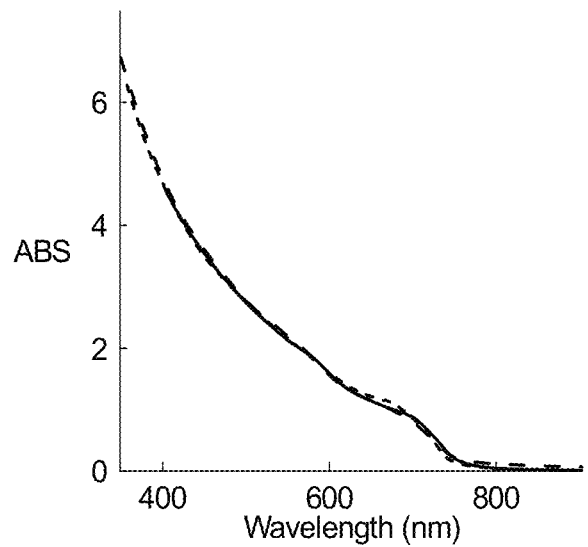
FIG. 15 is a UV-Visible spectra of wires made according to the procedures of Example 1 (solid), Example 2 (dots), and Example 3 (dash).

FIG. 15 is a UV-Visible spectra of wires made according to the procedures of Example 1 (solid), Example 2 (dots), and Example 3 (dash) illustrating that all preparations produce CdSe nanowires with optical absorption spectra typical of CdSe Nanowires.[58]

Figure 16A:
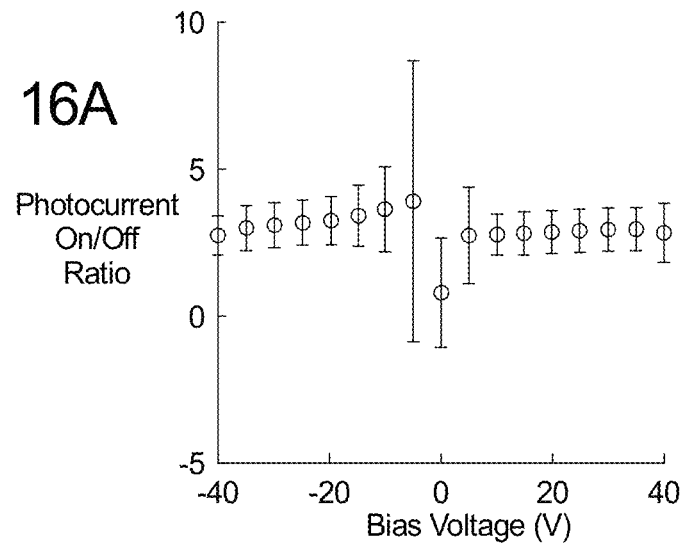
FIGS. 16a-16b show photocurrent response of photosensor devices made from CdSe nanowires.
Figure 16B:
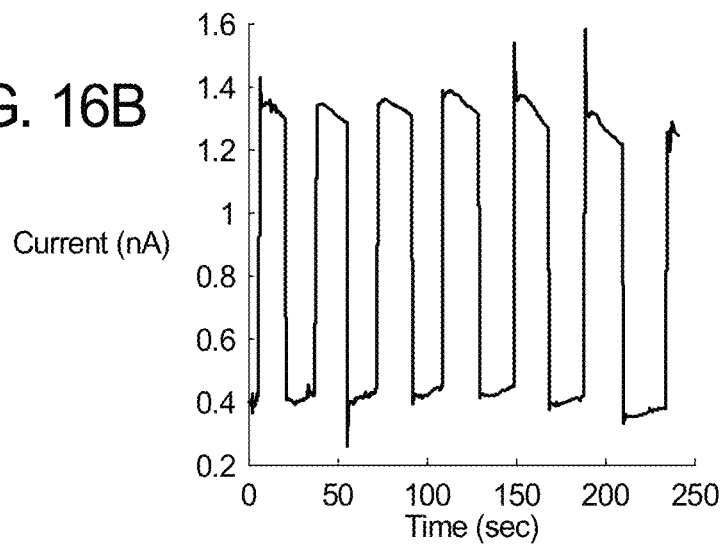

FIGS. 16a-16b illustrate a photosensor made from such CdSe nanowires. FIG. 16a includes electrical test data from CdSe nanowire-based photosensor devices showing the on/off (photocurrent/dark current) ratio as a function of bias voltage. Error bars are the standard deviation over 3 sweeps× 50 devices. FIG. 16b is a time trajectory showing photocurrent with light exposure. The current reached above ~1.2 nA when the nanowires were exposed to light; the current dropped to 0.4 nA when the light was off.

Example 4

Materials. 1-methyl-2-pyrrolidinone (99.5%, Aldrich), 1-octadecene (90%, Aldrich), acetonitrile (99.9%, Fisher Chemical), $BiCl_3$ (99.999%, Strem), diphenyl ether (99%, Aldrich), hexanes (ACS grade, VWR), 2-popanol (ACS grade, VWR), oleic acid (90%, Aldrich), oleylamine (70% Aldrich), PbO (99.999%, Alfa Aesar), selenium (99.99%, Strem), 1-tetradecylphosphonic acid (97%, Strem), 1-tetradecylphosphonic acid diethyl ester (98%, Alfa), trioctylphosphine (90%, Aldrich), trioctylphosphine oxide (99%, Strem), toluene (ACS grade, VWR). 0.1M Se-ODE was prepared by dissolving selenium powder in 1-octadecene at 180° C. for 5 hr under inert atmosphere according to the procedure by Bullen et al. (Chem. Mater. 2010, 22, 4135-4143); trioctylphosphine oxide (TOPO) was recrystallized from acetonitrile prior to use; di-n-octylphosphinic acid (DOPA) was synthesized according to the procedure reported by Wang et al.[1]; a stock suspension of 2 mM $BiCl_3$ in NMP was prepared in advance; a stock solution of 1 mM TOPO dissolved in 1-octadecene and diphenyl ether was prepared in advance.

The continuous flow reactor for nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. Connections to the tubing were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of PbSe Nanowires using Se-ODE as a selenium source. PbO (446 mg), oleic acid (2.0 ml), 1-octadecene (6.0 ml), 1-tetradecylphosphonic acid (100 mg), 1-tetradecylphosphonate diethyl ester (100 mg), and trioctylphosphine (1.0 ml) is degassed with stirring in a round bottom flask at 120° C. for 1 hr. The temperature is raised to 150° C. under nitrogen atmosphere to complete the formation of lead oleate, and thereafter cooled to room temperature (Reagent A). 1 mM TOPO solution (1.0 ml) and 2 mM $BiCl_3$ suspension (0.2 ml) were mixed under nitrogen (Reagent B). 0.1M Se-ODE (2.0 ml) (Reagent C) and all the other reagents (A & B) were added to separate syringes. The lead (II) precursor solution is added to a syringe.

The reactor configuration follows FIG. 3, minus the mixer. The reactor consisted of two aluminum plates with 100 cm of PTFE tubing (i.d. 1/32") encased in a serpentine channel. Separately, the reactor was preheated to 220° C. on a hotplate while flowing 1-octadecene from three syringe pumps through it. The three flow lines were combined using a cross-connector into a single line that enters the reactor, and the temperature of the reactor was monitored using external temperature probes. When the reactor temperature stabilized at 220° C., the three Reagents A, B and C were flowed through the reactor at 0.1405, 0.0843, and 0.0142 mL/min, respectively, to give a 2 min residence time. The nanowire products were collected in a collection vessel downstream from the reactor and purified by conventional PbSe nanowire purification techniques.

Figure 17A:
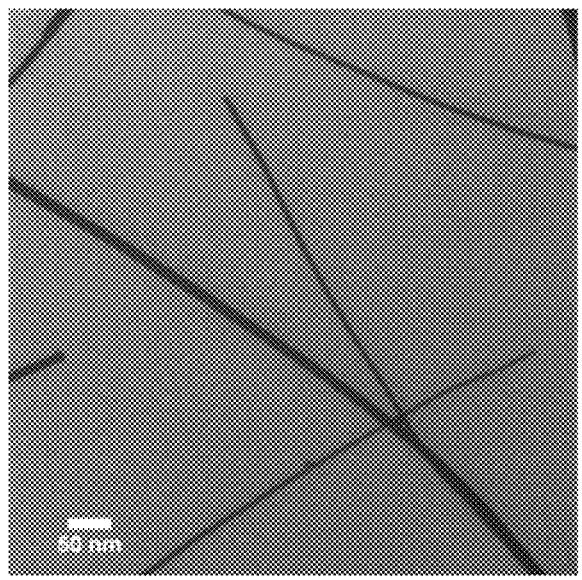
FIGS. 17a-17b are TEM images of PbSe nanowires according to the procedure of Example 4. The scale bars are equal to 50 nm.
Figure 17B:
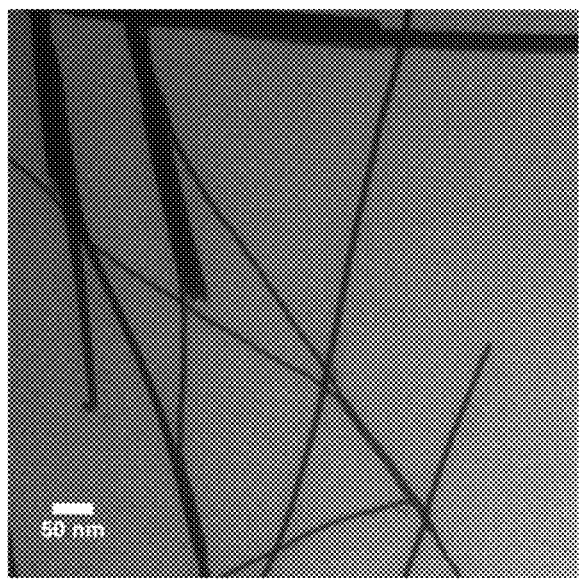

FIGS. 17a-17b include TEM images of the PbSe nanowires synthesized according to Example 4 and having an average diameter of 11.45 nm (σ=±20%).

Figure 18:
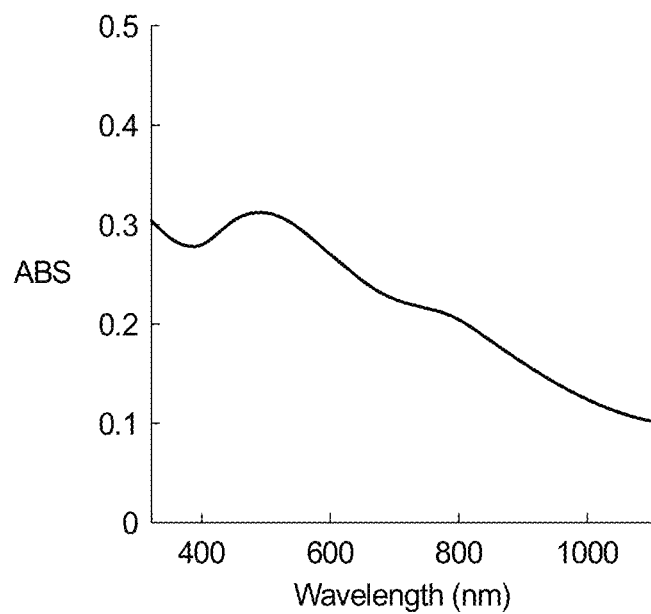
FIG. 18 is a UV-VIS Spectrum of PbSe nanowires made according to the procedure of Example 4.

FIG. 18 includes UV-VIS spectrum of PbSe nanowires made according to Example 4.

Example 5

Materials. 1-octadecene (90%, Aldrich), chloroform (certified ACS, Fisher Chemical), oleic acid (90%, Aldrich), oleylamine (70% Aldrich), trioctylphosphine (90%, Aldrich), toluene (ACS grade, VWR), zinc diethyl dithiocarbamate (97%, Aldrich) were used as received.

The continuous flow reactor for core nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. The flow rate in the core nanowire reactor is held at 0.24 ml/min to give a 2 min residence time for the nanowire production in the reactor. The continuous flow reactor for coating included two 250 ml round-bottom flask, connected in series, each having 300 cm of PTFE tubing (0.15875 cm ID, McMaster Carr) coiled through deaerated 1-octadecene. The flow rate in the shell coating reactor is held at 0.13 ml/min to give a 50 min residence time for the coating process. Connections to the tubings were made with syringe adapters and mixing connectors (Idex-HS), and syringe pumps were used to propel the solutions along the tubing.

Flow synthesis of CdSe/ZnS core/shell Nanowires. The crude core nanowire product exiting the production reaction (Examples 1, 2, and 3) is separated from the liquid phase by centrifugation. The core product is transferred to a round bottom flask using chloroform (2.0 ml). Oleic acid (1.0 ml), oleylamine (1.0 ml), and trioctylphosphine (5.0 ml) are added to the mixture. The mixture is degassed for 15 min at 50° C. on a Schlenk line, then cooled to room temperature under nitrogen atmosphere to form the cadmium selenide nanowire suspension (Reagent D). Separately, 0.055 M shell precursor solution is prepared by dissolving zinc diethyl dithiocarbamate (140 mg) in a mixture of oleylamine (2.0 ml) and 1-octadecene (5.0 ml), followed by sparging with nitrogen for 10 min to form the zinc sulfide shell precursor solution (Reagent E).

The reactor configuration follows FIG. 8, where i=0 for the mixer and purification module. In parallel, the shell coating reactors were preheating to 200° C. while flowing 1-octadecene from two syringe pumps through a T-connector to the two reactors which are connected in series. When the reactor temperature stabilized, the two reagent solutions (Reagents D and E) were each flowed through the coating reactors at 0.065 mL/min, with the coating process maintained at a 50 min residence time. The crude CdSe/ZnS core/shell nanowire products were collected in a collection vessel downstream from the coating reactors and purified by washing with toluene several times.

Figure 19A:
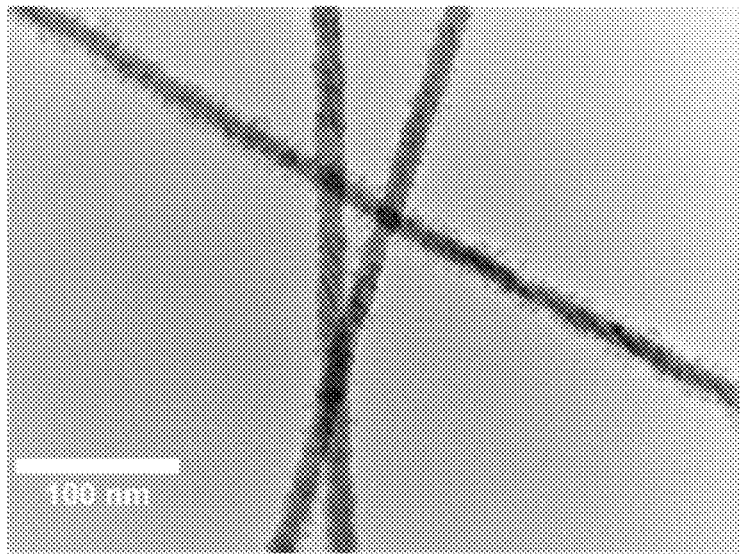
FIGS. 19a-19b are TEM images of CdSe/ZnS core/shell nanowires according to the procedure of Example 5. The scale bars are equal to 100 nm.
Figure 19B:
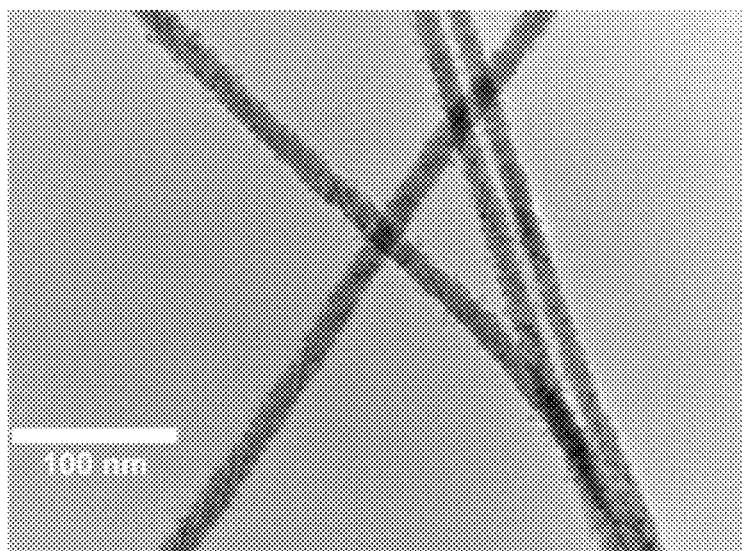

FIGS. 19*a*-19*b* include TEM images of the CdSe/ZnS nanowires synthesized according to Example 5. The diameter of the core/shell nanowires is 21.91 nm ($\sigma=\pm22\%$) and were made from core nanowires with diameter 15.55 nm ($\sigma=\pm18\%$).

Example 6

Materials. 1-methyl-2-pyrrolidinone (99.5%, Aldrich), 1-octadecene (90%, Aldrich), acetonitrile (99.9%, Fisher Chemical), $BiCl_3$ (99.999%, Strem), CdO (99.5%, Aldrich), diphenyl ether (99%, Aldrich), methanol (ACS grade, VWR), oleic acid (90%, Aldrich), oleylamine (70% Aldrich), selenium (99.99%, Strem), trioctylphosphine (90%, Aldrich), trioctylphosphine oxide (99%, Strem), toluene (ACS grade, VWR). 0.1M Se-ODE was prepared by dissolving selenium powder in 1-octadecene at 180° C. for 5 hr under inert atmosphere according to the procedure by Bullen et al.[42]; trioctylphosphine oxide (TOPO) was recrystallized from acetonitrile prior to use; di-n-octylphosphinic acid (DOPA) was synthesized according to the procedure reported by Wang et al.[1]; a stock suspension of 2 mM $BiCl_3$ in NMP was prepared in advance.

The continuous flow reactor for precursor synthesis included a 250 ml round-bottom flask having 250 cm of PTFE tubing (0.15875 cm ID, McMaster Carr) coiled through deaerated 1-octadecene. The flow rate in the precursor reactor is held at 0.06 ml/min to give a 82.5 min residence time. The continuous flow reactor for core nanowire synthesis is an aluminum block containing a serpentine channel that is lined with a PTFE tubing (ID=0.079375 cm) and heated on a hotplate. The channel in the aluminum block has a length of ~100 cm and was made with a CNC milling machine. Connections to the tubings were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of CdSe Nanowires using Se-ODE as a selenium source. CdO (60 mg), DOPA (12 mg), oleic acid (0.8 ml), TOPO (2.5 g), 1-octadecene (1.0 ml), and diphenyl ether (1.6 ml) were degassed for 1 hr in a 3-neck round bottom flask at 80° C. This cadmium precursor mixture was then cooled to room temperature under nitrogen atmosphere. The cadmium precursor reactor was pre-heated to 300° C. while flowing solvent through it. The cadmium precursor was produced following the reactor configuration in FIG. 1. When the reactor temperature stabilized at 300° C., the cadmium precursor mixture was added to a syringe and flowed through the cadmium precursor reactor with the aid of a syringe pump at 0.06 mL/min to give an 82.5 min residence time. The cadmium oleate solution exiting this reactor was collected in a round bottom flask under nitrogen flow, and later added to a syringe (Reagent A). 1-octadecene (1.0 ml) and trioctylphosphine (0.12 ml) were mixed under nitrogen (Reagent B). 0.1M Se-ODE (4.7 ml) and 2 mM $BiCl_3$ suspension (0.2 ml) were mixed under nitrogen (Reagent C). All the reagent solutions were added to three separate syringes.

The reactor configuration follows FIG. 3, minus the mixer. The reactor consisted of two aluminum plates with 100 cm of PTFE tubing (i.d. 1/32") encased in a serpentine channel. Separately, the reactor was preheated to 240° C. on a hotplate while flowing 1-octadecene from three syringe pumps through it. The three flow lines were combined using a cross-connector into a single line that enters the reactor, and the temperature of the reactor was monitored using external temperature probes. When the reactor temperature stabilized at 240° C., the three Reagents A, B and C were flowed through the reactor at 0.1274, 0.0196, and 0.092 mL/min, respectively, to give a 2 min residence time. The nanowire products were collected in a collection vessel downstream from the reactor and purified by conventional CdSe nanowire purification techniques.

Figure 20:
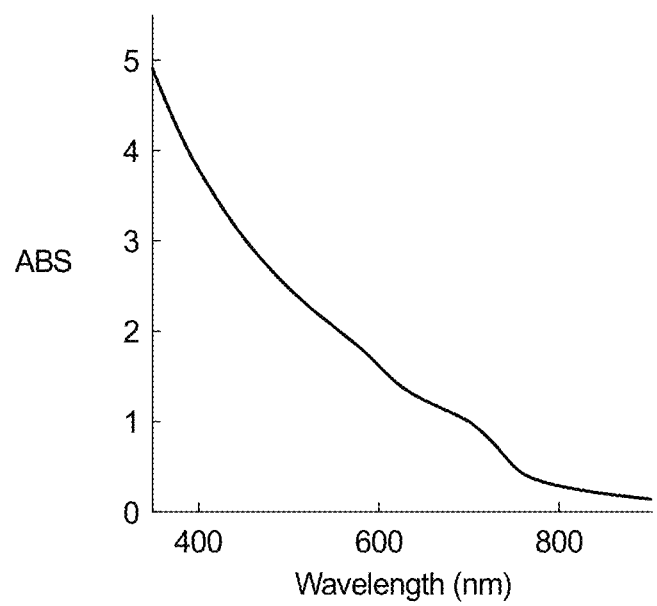
FIG. 20 is UV-VIS spectrum of CdSe nanowires according to the procedure of Example 6.

FIG. 20 is a UV-VIS spectrum showing the optical absorption of CdSe Nanowires produced according to example 6.

Example 7

Materials. 1-methyl-2-pyrrolidinone (99.5%, Aldrich), 1-octadecene (90%, Aldrich), $BiCl_3$ (99.999%, Strem), CdO (99.5%, Aldrich), methanol (ACS grade, VWR), oleic acid (90%, Aldrich), hexadecylamine (90% Acros), sulfur (99+%, Strem), trioctylphosphine (90%, Aldrich), trioctylphosphine oxide (99%, Strem), toluene (ACS grade, VWR). 1M TOP-S was prepared by dissolving sulfur powder in trioctylphosphine under inert atmosphere; a stock suspension of 2 mM $BiCl_3$ in NMP was prepared in advance. The continuous flow reactor for precursor synthesis included a 250 ml round-bottom flask having 300 cm of PTFE tubing (0.15875 cm ID, McMaster Carr) coiled through deaerated 1-octadecene. The flow rate in the precursor reactor is held at 0.3 ml/min to give a 19 min residence time. Connections to the tubings were made with syringe adapters and mixing connectors (Idex-HS), and syringe pumps were used to propel the solutions along the tubing. The flow rate in the reactor is held at 0.24 ml/min to give a 2 min residence time for the nanowire production in the reactor.

Flow synthesis of CdS Nanowires using TOP-S as a sulfur source. CdO (64 mg), hexadecylamine (24 mg), oleic acid (0.8 ml), and 1-octadecene (5.0 ml) were degassed for 1 hr in a 3-neck round bottom flask at 80° C. The temperature was then raised to 300° C. under nitrogen atmosphere until it turned clear indicating the formation of cadmium oleate. The mixture was cooled to room temperature under nitrogen atmosphere. 1M TOP-S (0.08 ml) and 2 mM $BiCl_3$ suspension (0.05 ml) were added to the reaction mixture and stirred.

The reactor configuration follows FIG. 2. Separately, the reactor was preheated to 300° C. on a hotplate while flowing 1-octadecene from a syringe pump through it. When the reactor temperature stabilized at 300° C., the reagent mixture was added to a syringe and flowed through the reactor at 0.3 mL/min for a 19.8 min residence time. The nanowire products were collected in a collection vessel downstream from the reactor and purified by conventional CdS nanowire purification techniques.

Figure 21:
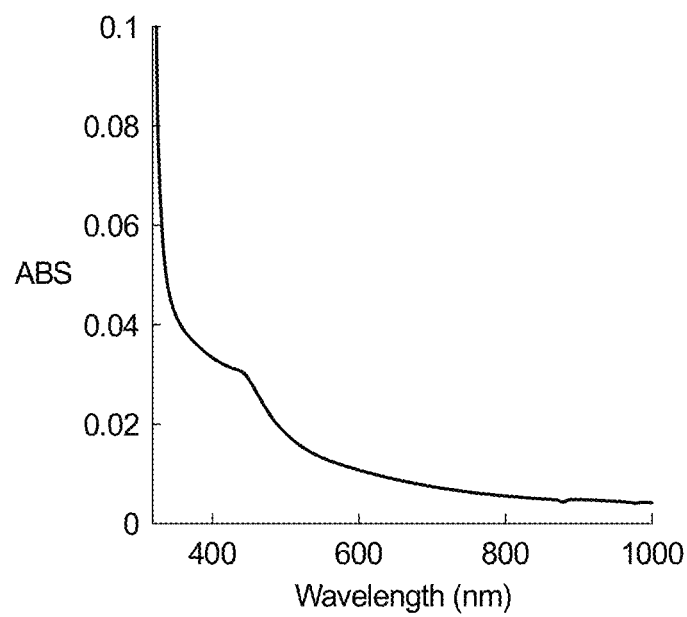
FIG. 21 is UV-VIS spectrum of CdS nanowires according to the procedure of Example 7.

FIG. 21 is a UV-VIS spectrum showing the optical absorption of CdS Nanowires produced according to Example 7.

It should be noted that various changes and modifications to the embodiments described herein will be apparent to those skilled in the art. Such changes and modifications may be made without departing from the spirit and scope of the present invention and without diminishing its attendant advantages. For example, various embodiments of the method may be provided based on various combinations of the features and functions from the subject matter provided herein.

The following references are not admitted prior art, but can be used to guide one skilled in the art in the practice of the invention and are incorporated herein by reference in their entirety.

[1] Wang F, Tang R, Kao J L-F L-F, Dingman S D, Buhro W E. Spectroscopic Identification of Tri-n-octylphosphine

[1] Oxide (TOPO) Impurities and Elucidation of Their Roles in Cadmium Selenide Quantum-Wire Growth. J Am Chem Soc 2009; 131:4983-94.
[2] Wang F, Tang R, Buhro W E. The trouble with TOPO; identification of adventitious impurities beneficial to the growth of cadmium selenide quantum dots, rods, and wires. Nano Lett 2008; 8:3521-4.
[3] Kuno M, Ahmad O, Protasenko V, Bacinello D, Kosel T H. Solution-Based Straight and Branched CdTe Nanowires. Chem Mater 2006; 18:5722-32.
[4] Grebinski J W, Hull K L, Zhang J, Kosel T H, Kuno M. Solution-Based Straight and Branched CdSe Nanowires. Chem Mater 2004; 16:5260-72.
[5] Zhuang X, Ning C Z, Pan A. Composition and bandgap-graded semiconductor alloy nanowires. Adv Mater 2012; 24:13-33.
[6] Li Z, Kurtulus O, Fu N, Wang Z, Kornowski A, Pietsch U, et al. Controlled Synthesis of CdSe Nanowires by Solution-Liquid-Solid Method. Adv Funct Mater 2009; 19:3650-61.
[7] Kuno M. An overview of solution-based semiconductor nanowires: synthesis and optical studies. Phys Chem Chem Phys 2008; 10:620.
[8] Wang F, Dong A, Sun J, Tang R, Yu H, Buhro W E. Solution-liquid-solid growth of semiconductor nanowires. Inorg Chem 2006; 45:7511-21.
[9] Zhuang Z, Peng Q, Li Y. Controlled synthesis of semiconductor nanostructures in the liquid phase. Chem Soc Rev 2011; 40:5492.
[10] Gómez-de Pedro S, Martínez-cisneros C S, Puyol M, Alonso-Chamarro J, Pedro S G, Alonso J. Microreactor with integrated temperature control for the synthesis of CdSe nanocrystals Electronic Supplementary Information (ESI) Table of contents Temperature characterization of the microsystem. Lab Chip 2012; 12:1-4.
[11] Chan E M, Xu C, Mao A W, Han G, Owen J S, Cohen B E, et al. Reproducible, high-throughput synthesis of colloidal nanocrystals for optimization in multidimensional parameter space. Nano Lett 2010; 10:1874-85.
[12] Puthussery J, Lan A, Kosel T H, Kuno M. Band-Filling of Solution-Synthesized CdS Nanowires. ACS Nano 2008; 2:357-67.
[13] Onicha A C, Petchsang N, Kosel T H, Kuno M K. Controlled synthesis of compositionally tunable ternary PbSe(x)S(1−x) as well as binary PbSe and PbS nanowires. ACS Nano 2012; 6:2833-43.
[14] Petchsang N, Shapoval L, Vietmeyer F, Yu Y, Hodak J H, Tang I-M, et al. Low temperature solution-phase growth of ZnSe and ZnSe/CdSe core/shell nanowires. Nanoscale 2011; 3:3145-51.
[15] Murray C B, Kagan C R, Bawendi M G. Synthesis and Characterization of Monodisperse Nanocrystals and Close-Packed Nanocrystal Assemblies. Annu Rev Mater Sci 2000; 30:545-610.
[16] Cho K-S, Talapin D V, Gaschler W, Murray C B. Designing PbSe nanowires and nanorings through oriented attachment of nanoparticles. J Am Chem Soc 2005; 127:7140-7.
[17] Winterton J D, Myers D R, Lippmann J M, Pisano A P, Doyle F M. A novel continuous microfluidic reactor design for the controlled production of high-quality semiconductor nanocrystals. J Nanoparticle Res 2008; 10:893-905.
[18] Yu K, Ouyang J, Leek D M. In-situ observation of nucleation and growth of PbSe magic-sized nanoclusters and regular nanocrystals. Small 2011; 7:2250-62.
[19] Yu K. CdSe Magic-Sized Nuclei, Magic-Sized Nanoclusters and Regular Nanocrystals: Monomer Effects on Nucleation and Growth. Adv Mater 2012; 24:1123-32.
[20] Jiang Z-J, Kelley D F. Role of magic-sized clusters in the synthesis of CdSe nanorods. ACS Nano 2010; 4:1561-72.
[21] Cossairt B M, Owen J S. CdSe Clusters: At the Interface of Small Molecules and Quantum Dots. Chem Mater 2011; 23:3114-9.
[22] Uri Banin S H K. Method for producing inorganic semiconductor nanocrystalline rods and their use. U.S. Pat. No. 6,788,453 B2, 2002.
[23] Fanfair D D, Korgel B A. Low temperature synthesis of nanowires in solution. U.S. Pat. No. 8,110,510 B1, 2005.
[24] Zehnder D A, Bruchez M P, Treadway J A, Earhart J P. Flow synthesis of quantum dot nanocrystals. U.S. Pat. No. 6,682,596 B2, 2004.
[25] Alivisatos A P, Olshaysky M A. Preparation of III-V semiconductor nanocrystals. U.S. Pat. No. 5,505,928 A, 1996.
[26] Han C-S, Jeong S, Seo W. Apparatus and Method for Manufacturing Quantum Dot. U.S. Pat. No. 8,354,090 B2, 2013.
[27] Yen B, Guenther A, Jensen K F, Bawendi M G, Schmidt M. Flow Method and Reactor for Manufacturing Noncrystals. U.S. Pat. No. 7,316,967 B2, 2008.
[28] Murray C, Norris D, Bawendi M G. Synthesis and characterization of nearly monodisperse CdE (E=S, Se, Te) semiconductor nanocrystallites. J Am Chem Soc 1993; 115:8706-15.
[29] Wang F, Buhro W E. Morphology control of cadmium selenide nanocrystals: insights into the roles of di-n-octylphosphine oxide (DOPO) and ucid (DOPA). J Am Chem Soc 2012; 134:5369-80.
[30] Yen B K H K H, Stott N E E, Jensen K F F, Bawendi M G. A Continuous-Flow Microcapillary Reactor for the Preparation of a Size Series of CdSe Nanocrystals. Adv Mater 2003; 15:1858-62.
[31] Krishnadasan S, Brown R J C, DeMello A J, DeMello J C. Intelligent routes to the controlled synthesis of nanoparticles. Lab Chip 2007; 7:1434-41.
[32] Marre S, Park J, Rempel J, Guan J, Bawendi M G, Jensen K F. Supercritical Continuous-Microflow Synthesis of Narrow Size Distribution Quantum Dots. Adv Mater 2008; 20:4830-4.
[33] Yang H, Luan W, Cheng R, Chu H, Tu S. Synthesis of quantum dots via microreaction: structure optimization for microreactor system. J Nanoparticle Res 2011; 13:3335-44.
[34] Wu D, Kordesch M E, Van Patten P G. A New Class of Capping Ligands for CdSe Nanocrystal Synthesis. Chem Mater 2005; 17:6436-41.
[35] Bullen C R, Mulvaney P. Nucleation and Growth Kinetics of CdSe Nanocrystals in Octadecene. Nano Lett 2004; 4:2303-7.
[36] Kopping J T, Patten T E. Identification of acidic phosphorus-containing ligands involved in the surface chemistry of CdSe nanoparticles prepared in tri-N-octylphosphine oxide solvents. J Am Chem Soc 2008; 130:5689-98.
[37] Li Z, Ji Y, Xie R, Grisham S Y, Peng X. Correlation of CdS nanocrystal formation with elemental sulfur activation and its implication in synthetic development. J Am Chem Soc 2011; 133:17248-56.
[38] Yang H, Luan W, Tu S, Wang Z M. High-Temperature Synthesis of CdSe Nanocrystals in a Serpentine Microchannel: Wide Size Tunability Achieved under a Short Residence Time. Cryst Growth Des 2009; 9:1569-74.
[39] Amelia M, Impellizzeri S, Monaco S, Yildiz I, Silvi S, Raymo F M, et al. Structural and size effects on the spectroscopic and redox properties of CdSe nanocrystals in solution: the role of defect states. Chemphyschem 2011; 12:2280-8.

[40] Goebl J A, Black R W, Puthussery J, Giblin J, Kosel T H, Kuno M. Solution-based II-VI core/shell nanowire heterostructures. J Am Chem Soc 2008; 130:14822-33.

[41] Evans C M, Evans M E, Krauss T D. Mysteries of TOPSe revealed: insights into quantum dot nucleation. J Am Chem Soc 2010; 132:10973-5.

[42] Bullen C R, van Embden J, Jasieniak J, Cosgriff J E, Mulder R J, Rizzardo E, et al. High Activity Phosphine-Free Selenium Precursor Solution for Semiconductor Nanocrystal Growth. Chem Mater 2010; 22:4135-43.

[43] Jasieniak J, Bullen C R, van Embden J, Mulvaney P. Phosphine-free synthesis of CdSe nanocrystals. J Phys Chem B 2005; 109:20665-8.

[44] Liu L, Zhuang Z, Xie T, Wang Y-G, Li J, Peng Q, et al. Shape control of CdSe nanocrystals with zinc blende structure. J Am Chem Soc 2009; 131:16423-9.

[45] Shen H, Wang H, Li X, Niu J Z, Wang H, Chen X, et al. Phosphine-free synthesis of high quality ZnSe, ZnSe/ZnS, and Cu-, Mn-doped ZnSe nanocrystals. Dalton Trans 2009: 10534-40.

[46] Jasieniak J, Mulvaney P. From Cd-rich to Se-rich—The manipulation of CdSe nanocrystal surface stoichiometry. J Am Chem Soc 2007; 129:2841-8.

[47] Mahler B, Lequeux N, Dubertret B. Ligand-controlled polytypism of thick-shell CdSe/CdS nanocrystals. J Am Chem Soc 2010; 132:953-9.

[48] Lu X, Hanrath T, Johnston K P, Korgel B a. Growth of Single Crystal Silicon Nanowires in Supercritical Solution from Tethered Gold Particles on a Silicon Substrate. Nano Lett 2003; 3:93-9.

[49] McPeak K M, Baxter J B. ZnO Nanowires Grown by Chemical Bath Deposition in a Continuous Flow Microreactor. Cryst Growth Des 2009; 9:4538-45.

[50] Mcpeak K, Baxter J B. Microreactor for Solution Deposition and Method of Use.pdf. U S 20090291557 A1, 2009.

[51] Laocharoensuk R, Palaniappan K, Smith N A, Dickerson R M, Werder D J, Baldwin J K, et al. Flow-based solution-liquid-solid nanowire synthesis. Nat Nanotechnol 2013; 8:660-6.

[52] Puthussery J, Kosel T H, Kuno M. Facile synthesis and size control of II-VI nanowires using bismuth salts. Small 2009; 5:1112-6.

[53] Wang J, Chen K, Gong M, Xu B, Yang Q. Solution-solid-solid mechanism: Superionic conductors catalyze nanowire growth. Nano Lett 2013; 13:3996-4000.

[54] Yong K-T, Sahoo Y, Choudhury K R, Swihart M T, Minter J R, Prasad P N, et al. Control of the Morphology and Size of PbS Nanowires Using Gold Nanoparticles. Chem Mater 2006; 18:5965-72.

[55] Yu H, Buhro W E. Solution-Liquid-Solid Growth of Soluble GaAs Nanowires. Adv Mater 2003; 15:416-9.

[56] Liu H, Owen J S, Alivisatos A P. Mechanistic study of precursor evolution in colloidal group II-VI semiconductor nanocrystal synthesis. J Am Chem Soc 2007; 129:305-12.

[57] Petchsang N, McDonald M P, Sinks L E, Kuno M. Light induced nanowire assembly: the electrostatic alignment of semiconductor nanowires into functional macroscopic yarns. Adv Mater 2013; 25:601-5.

[58] Yu H, Li J, Loomis R A, Gibbons P C, Wang L-W, Buhro W E. Cadmium selenide quantum wires and the transition from 3D to 2D confinement. J Am Chem Soc 2003; 125: 16168-9.

We claim:

1. A continuous flow method of producing nanowires, the method comprising:
   adding a metal precursor solution to a first continuous flow reactor;
   adding an anion precursor solution to the first continuous flow reactor;
   adding a catalyst precursor solution to the first continuous flow reactor; and
   creating a plurality of metal-anion nanowires having an average length of 1 to 40 μm, an average diameter of 1 to 100 nm, and an average aspect ratio (length to width ratio) of 10:1 to 1000:1;
   wherein the first continuous flow reactor is maintained at a temperature between, and including, 170° C. to 300°-C.

2. The method of claim 1 wherein the anion precursor solution includes selenium-octadecene, selenium-trioctylphosphine, sulfur-octadecene, or sulfur-trioctylphosphine.

3. The method of claim 1 wherein the metal precursor includes cadmium or lead.

4. The method of claim 1 wherein the metal precursor solution includes cadmium, diphenyl ether, octadecene, and trioctylphosphine oxide.

5. The method of claim 1 wherein at least one of the metal precursor solution and the anion precursor solution include a catalyst precursor solution, wherein the catalyst precursor solution includes a bismuth compound and a high boiling point solvent, wherein the high boiling point solvent has a boiling point of greater than, or equal to, 200° C.

6. The method of claim 1 wherein the plurality of nanowires are CdSe nanowires.

7. The method of claim 1 wherein the plurality of nanowires are Group III-V, II-VI, and IV-VI semiconductor nanowires.

8. The method of claim 1 further comprising
   combining the metal precursor solution and the anion solution in a first single channel to form a combined solution, wherein the first single channel diverges into a plurality of channels, wherein the plurality of channels converge into a second single channel, wherein the second single channel is connected to the first continuous flow reactor;
   mixing the combined solution by pumping the combined solution through the plurality of channels; and
   recombining the combined solution in the second single channel.

9. The method of claim 1 further comprising
   adding a coating precursor solution to a second continuous flow reactor, wherein the second continuous flow reactor is in fluid communication with the first continuous flow reactor, wherein the second continuous flow reactor is maintained at a temperature between, and including, 90° C. to 250° C.; and
   pumping the plurality of nanowires from the first continuous flow reactor flow into a second continuous flow reactor, wherein the plurality of nanowires are coated with at least a portion of the decomposed elements of the coating precursor solution to form a plurality of coated nanowires.

10. The method of claim 9 wherein the coating precursor solution includes zinc diethyl dithiocarbamate as the sole source of zinc and sulfur of the coated nanowires.

11. The method of claim 9 wherein the plurality of coated nanowires include CdSe/ZnS core/shell nanowires.

* * * * *